US012567459B2

(12) United States Patent
Nakai

(10) Patent No.: US 12,567,459 B2
(45) Date of Patent: Mar. 3, 2026

(54) APPARATUS FOR TSV DATA OUTPUT CONTROL IN MULTIPLE CORE DIES

(71) Applicant: MICRON TECHNOLOGY, INC., Boise, ID (US)

(72) Inventor: Kiyoshi Nakai, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 18/752,008

(22) Filed: Jun. 24, 2024

(65) Prior Publication Data

US 2025/0087262 A1 Mar. 13, 2025

Related U.S. Application Data

(60) Provisional application No. 63/582,455, filed on Sep. 13, 2023.

(51) Int. Cl.
*G11C 11/40* (2006.01)
*G11C 11/4076* (2006.01)
*G11C 11/4093* (2006.01)
*G11C 11/4096* (2006.01)
*H03K 19/20* (2006.01)
*H01L 23/48* (2006.01)

(52) U.S. Cl.
CPC ...... *G11C 11/4096* (2013.01); *G11C 11/4076* (2013.01); *G11C 11/4093* (2013.01); *H03K 19/20* (2013.01); *H01L 23/481* (2013.01)

(58) Field of Classification Search
CPC ............ G11C 11/4096; G11C 11/4076; G11C 11/4093; G11C 16/105; G11C 16/0483; H03K 19/20; H01L 23/481
See application file for complete search history.

(56) References Cited

U.S. PATENT DOCUMENTS

2009/0039492 A1* 2/2009 Kang ...................... G11C 5/02
257/E23.012
2010/0295600 A1* 11/2010 Kim .................. H03K 19/00392
327/365

* cited by examiner

*Primary Examiner* — Xiaochun L Chen
(74) *Attorney, Agent, or Firm* — Dorsey & Whitney LLP

(57) ABSTRACT

Embodiments of the disclosure provide an apparatus comprising: a plurality of TSVs; a plurality of core dies stacked with one another; and an output control circuit. Each core die includes a data output circuit coupled to one or more TSVs to output read data. The data output circuit includes a data splitter to provide first and second complementary read data in parallel based on the read data, an output data latch to latch the first and second read data, and an output data buffer to receive the first and second read data from the output data latch and drive the TSVs based on the first and second read data. The output control circuit provides a first reset signal to the output data buffer and a second reset signal to the data splitter or the output data buffer to disable the output of the read data to the TSVs.

20 Claims, 12 Drawing Sheets

APPARATUS FOR TSV DATA OUTPUT CONTROL IN MULTIPLE CORE DIES

CROSS REFERENCE TO RELATED APPLICATION(S)

This application claims priority to U.S. Provisional Application No. 63/582,455, filed Sep. 13, 2023. The aforementioned application is incorporated herein by reference, in its entirety, for any purpose.

BACKGROUND

High data reliability, high speed of memory access, lower power consumption, and reduced chip size are features that are demanded from a semiconductor memory. A three-dimensional (3D) memory device may be formed by stacking a plurality of memory dies (or memory chips) vertically and interconnecting the stacked memory dies using a plurality of through-silicon vias (TSVs). Benefits of the 3D memory device include shorter interconnects which reduce signal delays and power consumption, a greater number of vertical vias between layers which allow wide bandwidth buses between functional blocks in different layers, and a considerably smaller footprint. Thus, the 3D memory device contributes to higher memory access speed, lower power consumption, and chip size reduction. Example 3D memory devices include a High Bandwidth Memory (HBM) and a Hybrid Memory Cube (HMC). HBM is a type of memory including a high-performance dynamic random access memory (DRAM) interface die and vertically stacked DRAM core dies. HMC is another type of such memory.

3D memory devices use TSVs for data transition between an interface (IF) die and a plurality of core dies. Data is transmitted through one or more TSV data paths from one or more selected core dies to the IF die or vice versa. To achieve a higher speed data rate, seamless data transmission through TSVs (may also be referred to as gapless TSV data transfer) among multiple core dies is desired.

Since multiple core dies share one or more TSVs, in order to prevent data conflict on the TSV data paths, while one core die outputs data (such as read data from a memory array or a memory cell of that core die) to the TSVs, other core dies are kept on hold until the next data transmission. This requires accurate timing adjustment of data output to the shared or common TSVs among the core dies.

Each core die may include a data output circuit (may also be referred to as a TSV data output circuit) used for the data output to the shared TSVs. The timing adjustment of the data output requires accurate enable and disable control of the TSV data output circuit at each core die.

However, the TSV data output circuit may include metal oxide semiconductor field effect transistors (MOSFETs), and may suffer degradation over time by bias temperature instability (BTI), such as negative BTI (NBTI) and positive BTI (PBTI). For example, BTI degradation influences a pulse edge delay time of a signal that enables the data output to the shared TSVs from a selected core die among the plurality of core dies. If the enable pulse signal has a low clock duty where the signal keeps a low state for a longer time period for a write operation or for a standby mode period than being a high state for a read operation, a falling (or low) edge of the enable pulse signal delays more than a rising (or high) edge thereof and the delay increases over time due to the BTI degradation. This causes disable timing of data output of one core die to prolong more than a tolerable range and conflict with enable timing of data output of another core die. Such timing overlap leads to data transfer conflict on the shared TSV data paths between the core dies and affects the gapless TSV data transfer.

DETAILED DESCRIPTION

Figures 1A, 1B:
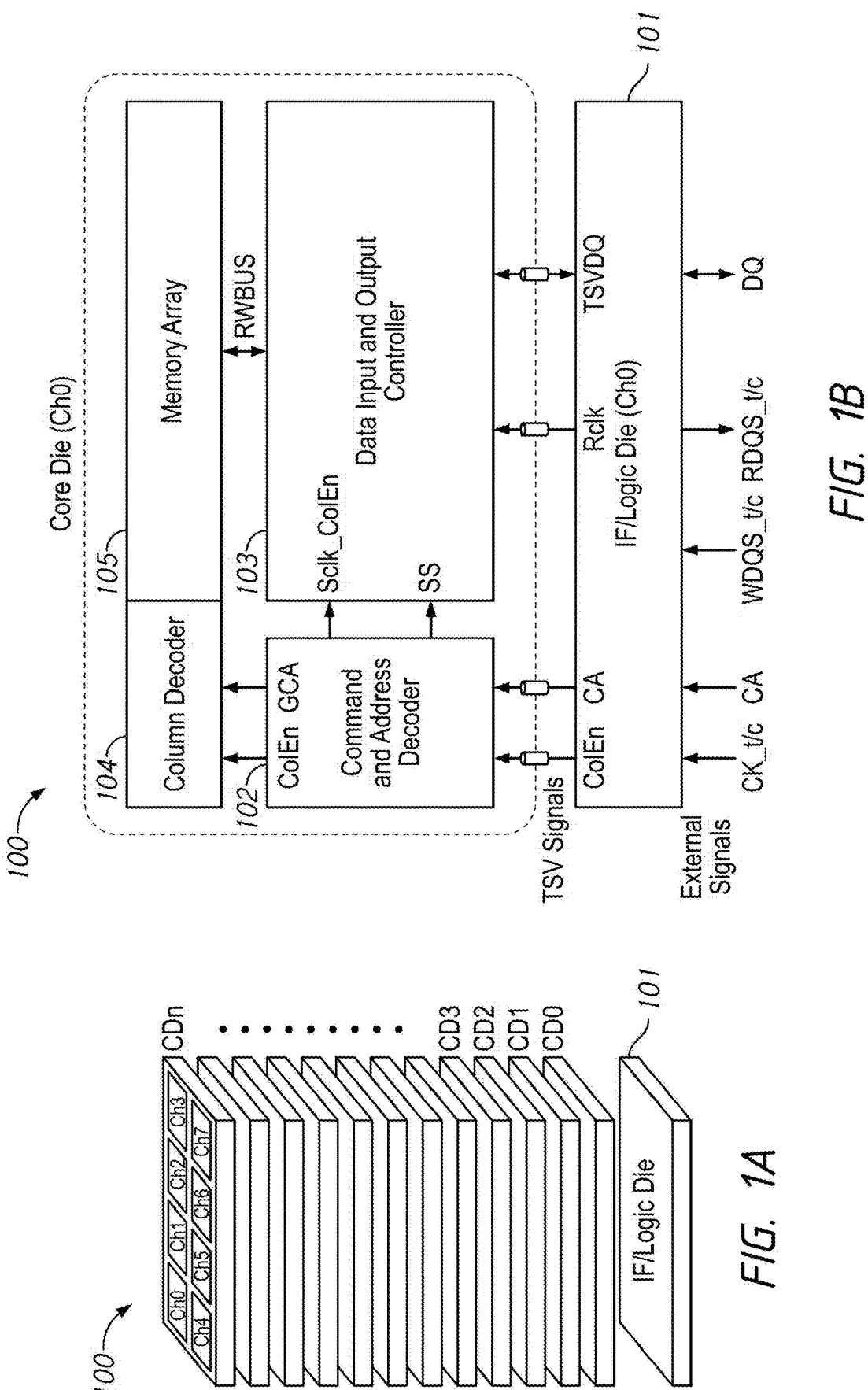
FIG. 1A is a schematic diagram of at least part of an example memory device in a perspective view according to an embodiment of the disclosure.
FIG. 1B is a block diagram of at least part of a core die of an example memory device according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, some of the same signs may be omitted for the same or substantially the same elements for ease of illustration. In the drawings, the dimensions and dimensional ratios of each unit do not necessarily match the actual dimensions and dimensional ratios in the embodiments.

FIG. 1A is a schematic diagram of at least part of an example memory device 100 in a perspective view according to an embodiment of the disclosure. FIG. 1B is a block diagram of at least part of an example core die of the memory device 100 according to an embodiment of the disclosure.

The memory device 100 may be a stacked memory device. In some embodiments, the memory device 100 may be a high bandwidth memory (HBM) or a hybrid memory cube (HMC). The memory device 100 is one example of a semiconductor device or an apparatus. The memory device 100 includes a plurality of core dies (or memory core dies) CDs stacked with one another on an interface (IF) die 101, forming multiple die layers. The core dies may also be referred to as core chips (or memory core chips). In some embodiments of the disclosure, the core dies are volatile memory, for example, double data rate (DDR) dynamic random access memory (DRAM). In other embodiments, the core dies include other types of memory. The IF die may include or may be part of a logic die. The IF die may be coupled to an interposer via external terminals. The term "coupled" herein may include "connected."

The stacked core dies CDs may be coupled with each other and with the IF die via a plurality of through-silicon vias (TSVs). Each core die CD may include a memory array for storing data and further include circuits for performing memory operations, such as read and write operations. Each core die CD may include a plurality of channels Ch. In some embodiments, a channel may be a circuit block operable as a single memory. In some embodiments, a channel may represent a separable addressable memory space that may be accessed to read data from the channel and to write data to the channel. Each core die CD in the illustrated example includes for each channel a command and address decoder 102, a data input and output controller 103, a column decoder 104, and a memory array 105. The core dies CDs are coupled to the IF die 101 via a plurality of TSVs for data and signal transmission.

The IF die 101 receives various external signals, for example, from a memory controller through an interposer. The IF die 101 and the memory controller may be coupled to the interposer via external terminals. The external signals include but are not limited to a clock signal CK_t/c, a column command and address signal CA, a write data strobe WDQS_t/c, a read data strobe RDQS_t/c, and a data input and output DQ. In response to the external signals, the IF die 101 generates and outputs various internal signals (herein may also be referred to as TSV signals) to be transmitted to the core dies CDs through TSVs. The internal signals include but are not limited to a column enable clock ColEn, a read clock Rclk, and TSV data input and output TSVDQ in addition to the CA signal.

In the core dies CDs, the command and address decoder 102 receives the ColEn and CA signals from the IF die 101 through the TSVs. The command and address decoder 102 generates and outputs a column enable clock Sclk_ColEn and a slice select (or core die select) signal SS to the data input and output controller 103. The slice select signal SS is a gating signal for the read clock Rclk. The command and address decoder 102 also outputs ColEn and a column command and address signal GCA to the column decoder 104. The data input and output controller 103 sends and receives the data to and from the memory array 105 through a read and write bus (RWBUS) for data read and write operations. RWBUS may include a plurality of RWBUSs as data transfer wirings. The memory array 105 may include a plurality of memory banks. Each memory bank may include a plurality of word lines, a plurality of bit lines, and a plurality of memory cells arranged at intersections of the word lines and the bit lines. The column decoder 104 decodes and obtains a column command and a column address based on the GCA received from the command and address decoder 102 for the data read and write operations at specific memory banks or memory cells in response to the decoded command and address.

Figures 2A, 2B:
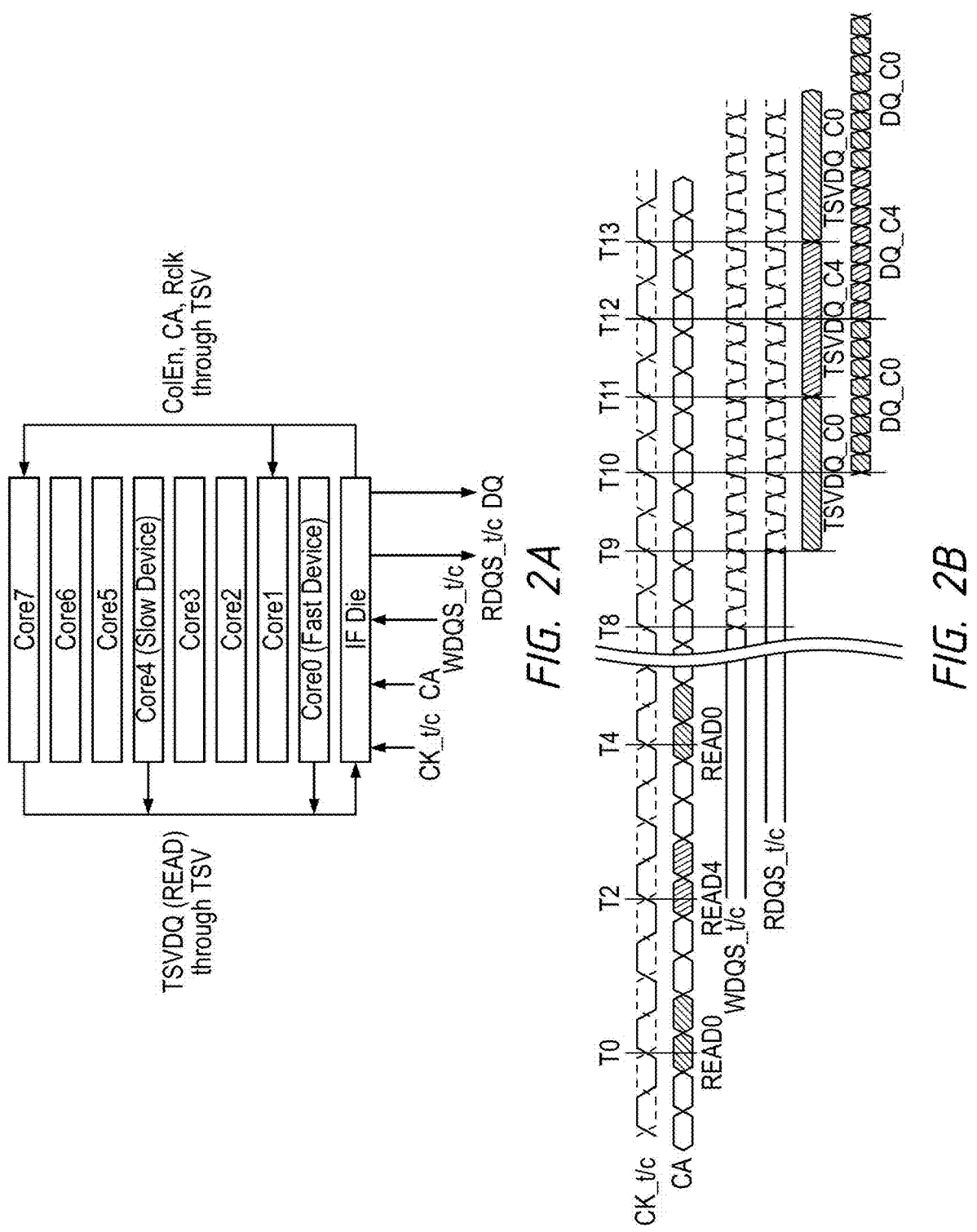
FIG. 2A illustrates an example data transfer from multiple core dies to an interface die according to an embodiment of the disclosure.
FIG. 2B is a timing diagram of an example data transfer according to an embodiment of the disclosure.

FIG. 2A illustrates example data transfer from multiple core dies to an interface die according to an embodiment of the disclosure. FIG. 2B is a timing diagram of an example data transfer according to an embodiment of the disclosure.

In the example illustrated in FIG. 2A, eight core dies Core 0-Core 7 and one IF die are stacked with one another and are coupled with a plurality of TSVs. Core 0-Core 7 and the IF die may correspond to the core dies CD0-CDn and the IF die 101 in FIGS. 1A and 1B, respectively. In the illustrated example, Core 0 includes a faster memory device, and Core 4 includes a slower memory device. For example, Core 0 may provide read data faster than Core 4; conversely, Core 4 may provide read data slower than Core 0. The example illustrated in FIG. 2B shows a case of two clock cycles of CK_t/c between data read operations of different core dies (i.e., Core 0 and Core 4 in the illustrated example). In response to the various internal signals as described with reference to FIG. 1B, which are generated based on the external signals received at the IF die including, among others, CK_t/c and CA, the data is first read from Core 0 for two cycles based on a read command to Core 0 at T0 (READ0), and after two cycles, the next data is read from Core 4 for two cycles based on the read command to Core 4 at T2 (READ4). While the data is being read from Core 0 for two cycles, Core 4 is maintained in a high impedance (Hi-Z) state. Controlled by a data output circuit at each of Core 0 and Core 4, the read data from Core 0 are transmitted to the IF die through TSVs at T9 (TSVDQ_C0), and immediately after, without any time gap, the read data from Core 4 is transmitted to the IF die through TSVs (TSVDQ_C4). The TSVs or TSVDQs are common nodes between all CDs including Core 0 and Core 4. The Core 0 read data and the Core 4 read data are then output from the IF die to the outside (DQ_C0, DQ_C4). This data output scheme represents one example of seamless TSV data transmission (or gapless TSV data transfer) without conflict between different core dies according to some embodiments of the disclosure.

Figures 3A, 3B:
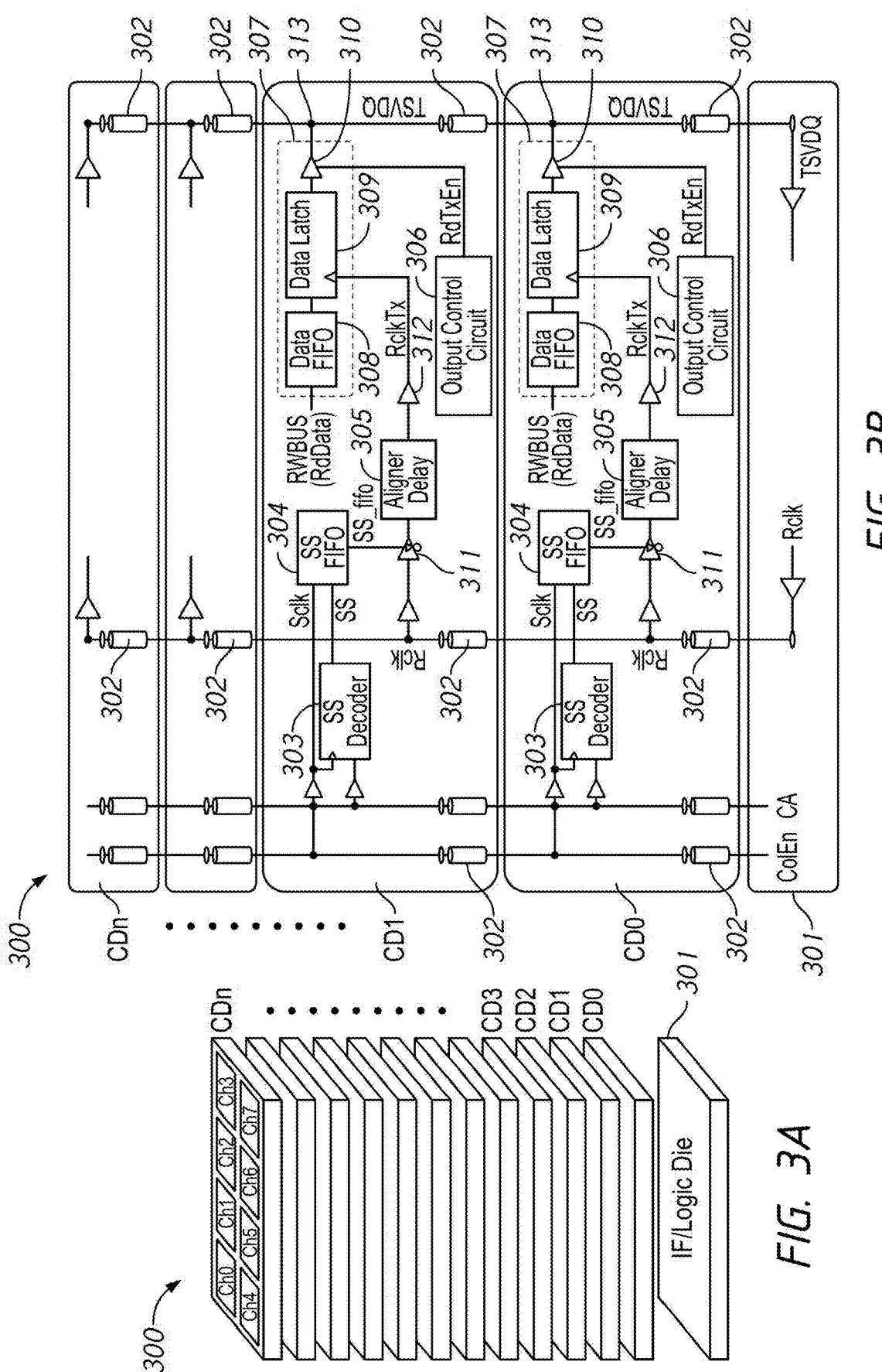
FIG. 3A is a schematic diagram of at least part of an example memory device in a perspective view according to an embodiment of the disclosure.
FIG. 3B is a block diagram of at least part of an example command and address decoder and data input and output controller of a core die of an example memory device according to an embodiment of the disclosure.

FIG. 3A is a schematic diagram of at least part of an example memory device 300 in a perspective view according to an embodiment of the disclosure. FIG. 3B is a block diagram of at least part of an example CA decoder and data input and output controller of a core die of the memory device 300 according to an embodiment of the disclosure. The memory device 300 may correspond to the memory device 100 of FIGS. 1A and 1B. A plurality of core dies CD0-CDn and an interface (IF) die 301 of the memory device 300 may correspond to the core dies CDs and the IF die 101 of the memory device 100.

The stacked core dies CD0-CDn are coupled with each other and with the IF die 301 via a plurality of TSVs 302. The TSVs 302 are used for data and signal transmission among the multiple core dies and the IF die 301. In some embodiments, each CD of the memory device 300 may include the same elements and configuration as the command and address decoder 102, the data input and output controller 103, the column decoder 104, and the memory array 105 of the memory device 100.

As with the example of FIG. 1B, the core dies CDs receive, among others, a column enable clock ColEn, a column command and address signal CA, and a read clock Rclk from the IF die 301 through the TSVs 302. Rclk controls data output of the core dies CDs to the TSVs 302 for a data read operation. Rclk control is commonly shared among the multiple core dies CDs. ColEn and CA includes information for identifying which CD to be selected and enabled for the data read operation responsive to Rclk.

In the example of FIG. 3B, each core die CD includes an SS decoder 303, an SS first-in first-out (FIFO) circuit or memory (may be referred to as an SS FIFO) 304 coupled to the SS decoder 303, an aligner delay circuit 305 coupled to the SS FIFO 304, and an output control circuit 306 coupled to the aligner delay circuit 305, and a data output circuit 307 coupled to the aligner delay circuit 305 and the output control circuit 306. Each core die CD also includes a clock buffer 311 coupled to the SS FIFO 304 and the aligner delay circuit 305 and a buffer 312 coupled to the aligner delay circuit 305 and the data output circuit 307. Although not fully depicted, all stacked CDs have the same or substantially the same circuit configuration.

The data output circuit 307 includes a data FIFO circuit (may be referred to as a data FIFO) 308 coupled to a read and write bus (RWBUS), an output data latch 309 coupled to the data FIFO 308, and an output data buffer 310 coupled to the output data latch 309 at its input node and to the TSV 302 at its output node. The TSV 302 may include one or more TSVs. The RWBUS may include one or more RWBUSs. Data (RdData) read from a memory array or a memory cell of the core die CD are transmitted through RWBUS to the data FIFO 308. The data FIFO 308 stores the received RdData. The output data latch 309 is also coupled to the aligner delay circuit 305. The output data buffer 310 is also coupled to the output control circuit 306 at another input terminal. RdData stored in the data FIFO 308 passes through the output data latch 309 and the output data buffer 310 and is output to the TSV 302. This output of RdData from the enabled CD is controlled based on RclkTx and RdTxEn. For example, in some embodiments of the disclosure, RclkTx clocks the data latch 309 to latch and provide RdData, and RdTxEn enables the output data buffer 310 to provide RdData to the TSV 302. RdTxEn also resets or disables the output data buffer 310 such that a node 313 coupled to the TSV 302 becomes a High-Z state. RclkTx and RdTxEn are output by the aligner delay circuit 305 through the buffer 312 and by the output control circuit 306, respectively, in response to Rclk received from the IF die 301 and SS decoded by the SS decoder 303 and stored at the SS FIFO 304.

In some embodiments, the SS decoder 303 may be included in the command and address decoder 102 in the core die CD of the memory device 100. In some embodiments, the SS FIFO 304, the aligner delay circuit 305, the output control circuit 306, and the data output circuit 307 (including the data FIFO 308, the output data latch 309, and the output data buffer 310) may be included in the data input and output controller 103 in the core die CD of the memory device 100. In some embodiments, the SS FIFO 304, the aligner delay circuit 305, and the output control circuit 306 may be at least part of or constitute a control circuit block. The data output circuit 307 may include a plurality of data output circuits (herein may be referred to as DQs).

Figure 4:
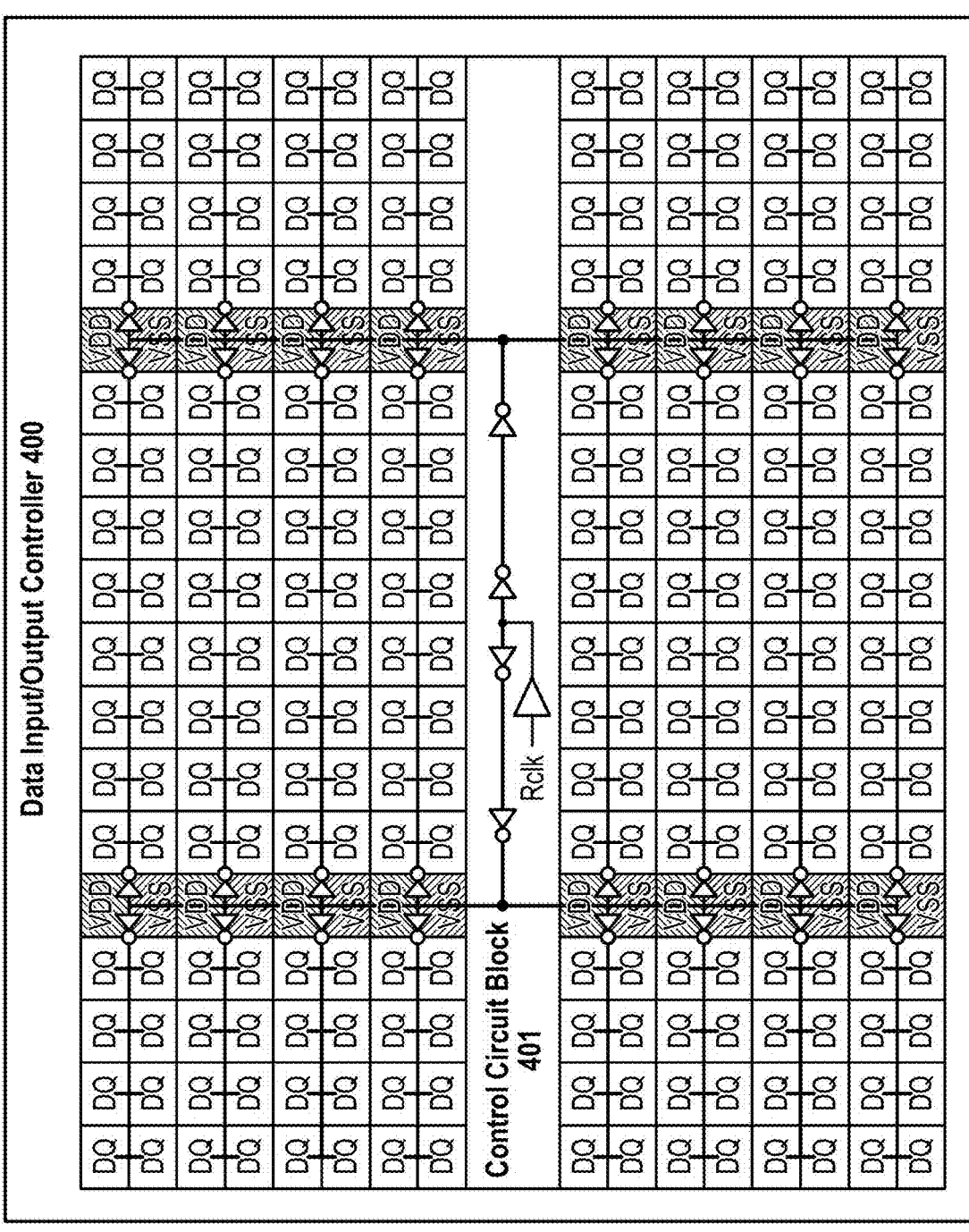
FIG. 4 depicts an example arrangement of data output circuits and a control circuit block in a data input and output controller of a core die of an example memory device according to an embodiment of the disclosure.

FIG. 4 depicts an example arrangement of the data output circuits DQs and the control circuit block in a data input and output controller 400 of a core die CD according to an embodiment of the disclosure. In the example arrangement, the data input and output controller 400 (which may correspond to the data input and output controller 103) includes the plurality of data output circuits DQs (each of which may correspond to the data output circuit 307) arranged in a matrix, and various signals output from the control circuit block 401 (which may include, among others, the SS FIFO 304, the aligner delay circuit 305, and the output control circuit 306) are distributed to the corresponding DQs through a tree-form path as illustrated. The signals from the control circuit block 401 are used for controlling the data output from DQs to TSVs and are generated in response to signals, such as a read clock Rclk (for example, Rclk illustrated in FIG. 1B), received from an IF die, such as the IF die 101/301. The generated signals may include, but may not be limited to, RclkTx and RdTxEn illustrated in FIG. 3B (and Rclkrst illustrated in FIGS. 6B, 7A-7B and 8A-8B and/or Drst illustrated in FIGS. 9A-9B and 10A-10B), which will be described in detail below.

Referring back to FIG. 3B, the ColEn and CA signals are decoded by the SS decoder 303 to generate a slice select (or core die select) signal SS that identifies which CD to be selected and enabled for the data read operation responsive to the read clock Rclk. In some embodiments, the SS decoder 303 may be included in the command and address decoder 102 of FIG. 1B, and the SS signal may correspond to the SS signal output from the command and address decoder 102. The SS signal output from the SS decoder 303 is stored at the SS FIFO 304 which is clocked by a column enable clock Sclk. The stored SS signal may be referred to as SS_fifo herein. In some embodiments, the Sclk clock may correspond to the Sclk_ColEn clock output from the command and address decoder 102. SS_fifo is provided to the clock buffer 311 and/or the output control circuit 306. SS_fifo may be used in providing RclkTx and RdTxEn by the aligner delay circuit 305 and the output control circuit 306, respectively, and used to determine whether the transmitted read clock Rclk is valid or not for each core die CD.

In response to SS_fifo and Rclk, the output control circuit 306 generates an output enable signal RdTxEn in either a high state or a low state. RdTxEn as a state control signal controls the enable and disable states of the output data buffer 310 of the data output circuit 307. For example, when RdTxEn is high, the output data buffer 310 is turned on to output RdData to the corresponding TSV 302 through the node 313. When RdTxEn is low, the output data buffer 310 is turned off to cause the node 313 coupled to the TSV 302 to be in a Hi-Z state so that no RdDtata is output to the TSV 302 from the selected CD. Hence, for that CD, TSV data output is disabled. Subsequently, for another or next selected CD, the TSV data output is enabled. For such disable control of the TSV data output, RdTxEn may be referred to as a reset signal of the output data buffer 310. The state of RdTxEn for each of multiple core dies is controlled to avoid conflict of data output to the shared TSVs 302 among the multiple core dies while achieving the seamless TSV data transmission.

Figures 5A, 5B:
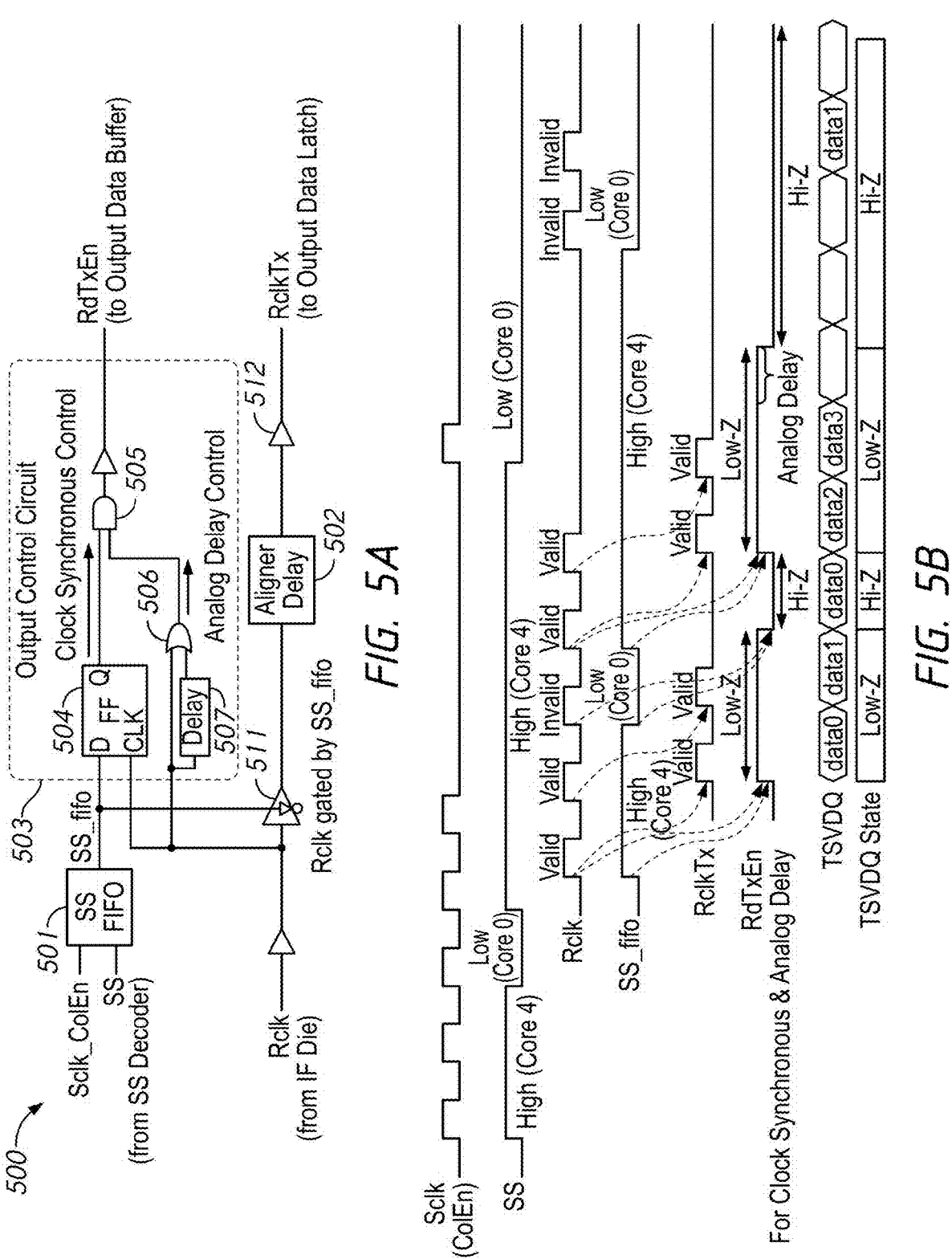
FIG. 5A is a circuit diagram of at least part of an example control circuit block according to an embodiment of the disclosure.
FIG. 5B is a timing diagram of various signals according to an embodiment of the disclosure.

FIG. 5A is a circuit diagram of at least part of an example control circuit block 500 according to an embodiment of the disclosure. FIG. 5B is a timing diagram of various signals according to an embodiment of the disclosure. The control circuit block 500 may correspond to the control circuit block 401 of FIG. 4. In some embodiments of the disclosure, the control circuit block 500 is included in the core dies CDs of FIG. 3B. The control circuit block 500 includes an SS FIFO 501, an aligner delay circuit 502, and an output control circuit 503, which may correspond to the SS FIFO 304, the aligner delay circuit 305, and the output control circuit 306 in FIG. 3B, respectively. The control circuit block also includes a buffer 511 coupled to the SS FIFO 501 and the aligner delay circuit 502 and a buffer 512 coupled to the aligner delay circuit 502 and an output data latch. The buffers 511 and 512 may correspond to the buffers 311 and 312, respectively, in FIG. 3B.

The timing diagram of FIG. 5B shows the case where Core 4 is selected and enabled (High SS_fifo) for the data output TSVDQ and is disabled when Core 0 is selected (Low SS_fifo). Core 4 and Core 0 may correspond to those among the plurality of core dies illustrated in FIGS. 2A and 2B, for example.

In the control circuit block 500, when SS_fifo stored at the SS FIFO 501 is in a high state, Rclk provided from an IF die (such as the IF die 301 in FIGS. 3A and 3B or the IF die 101 in FIG. 1B) through an TSV (such as the TSV 302 in FIG. 3B) is provided to the aligner delay circuit 502, which in turn generates and provides RclkTx to an output data latch (such as the output data latch 309 of the data output circuit 307 in FIG. 3B). As illustrated in FIG. 5B, when SS_fifo is in a high state for Core 4, which is selected and enabled for TSVDQ, in response to the valid Rclk signals, RclkTx turns high.

In the control circuit block 500, SS_fifo and Rclk are also provided to the output control circuit 503, which generates and provides RdTxEn to an output data buffer (such as the output data buffer 310 of the data output circuit 307 in FIG. 3B). SS_fifo and Rclk are provided to a data input and a clock input of a flip-flop (FF) register 504, respectively. This route is for clock synchronous control. The output of the FF register 504 is provided to one input of an AND logic gate 505. Rclk is also provided to one input of an OR logic gate 506 and a delay circuit 507, which provides an output to another input of the OR logic gate 506. The output of the OR logic gate 506 is provided to another input of the AND logic gate 505. This route is for analog delay control.

As illustrated in FIG. 5B, when both SS_fifo and Rclk for Core 4 turns high, RdTxEn for Core 4 turns high to enable the output data buffer for outputting the read data to the TSVs. The TSVDQ state becomes Low-Z. When SS_fifo turns low, Rclk is invalid for Core 4, and RdTxEn turns low to disable or reset the output data buffer. The TSVDQ state becomes Hi-Z. When SS_fifo turns high again, Rclk is valid for Core 4, and RdTxEn turns high to enable the output data buffer for the read data output. Accordingly, RdTxEn is synchronous with at least high edges (or rising edges) of Rclk and SS_fifo for turning high and a low edge (or a falling edge) of SS_fifo for turning low.

In some instances, the next, invalid Rclk signal may not come or SS_fifo stays high for a time period longer than required for the read data operation at the currently selected core die, Core 4. This delays RdTxEn from turning to the low state. When such instances occur, a delayed signal of the current (or previous) Rclk generated at the delay circuit 507 forces RdTxEn to turn low. This is done at the AND logic gate 505. The delayed signal is generated at a predetermined period of time elapsed from at least one of the rising and falling edges of the current (or previous), valid Rclk signal. The falling edge of the RdTxEn signal is created by this delayed signal. This way, the output data buffer is forced to be disabled to avoid being in the enabled state for an unnecessarily longer time period. This prevents current leakage and hence decreases current consumption at the output data buffer and other related circuits.

In other instances, due to bias temperature instability (BTI) degradation (especially, negative BTI (NBTI) degradation), the falling edge of RdTxEn may prolong over time, and RdTxEn may stay in the high state longer than the expected time period. This affects the disable/reset timing of the output data buffer of a current core die (for example, Core 4) and may cause conflict with the enable timing of the output data buffer of a next core die (for example, Core 0). Hence, the data transmission through the shared TSVs between the multiple core dies may conflict with each other.

Some embodiments of the disclosure described in detail below further addresses the above enable and disable timing overlap and hence the data transfer conflict among multiple core dies due to BTI degradation.

Figures 6A, 6B:
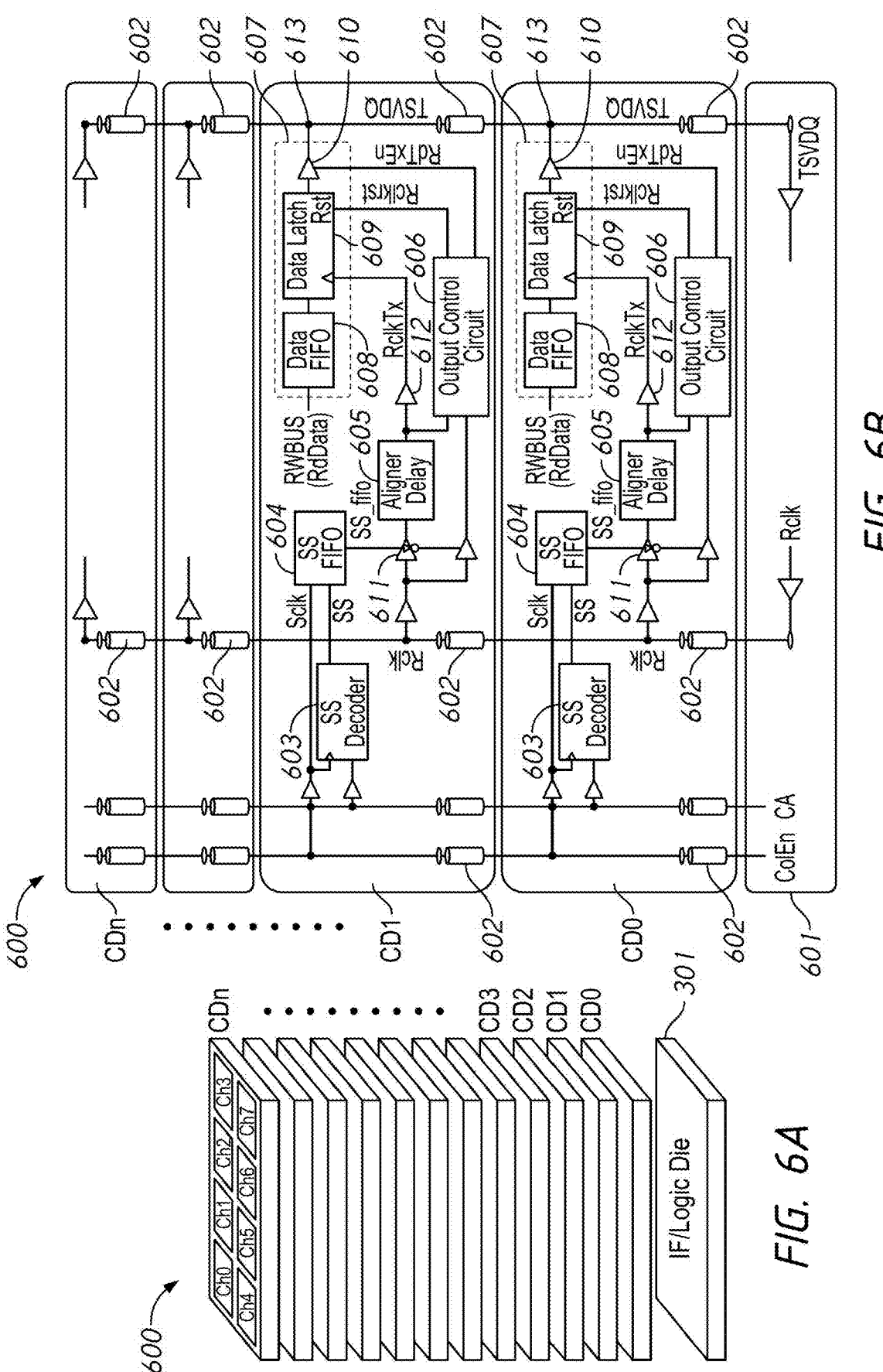
FIG. 6A is a schematic diagram of at least part of an example memory device in a perspective view according to an embodiment of the disclosure.
FIG. 6B is a block diagram of at least part of an example command and address decoder and data input and output controller of a core die of an example memory device according to an embodiment of the disclosure.

FIG. 6A is a schematic diagram of at least part of an example memory device 600 in a perspective view according to an embodiment of the disclosure. FIG. 6B is a block diagram of at least part of an example command and address decoder and data input and output controller of a core die of the memory device 600 according to an embodiment of the disclosure. The memory device 600 may correspond to the memory device 100 of FIGS. 1A and 1B. A plurality of core dies CD0-CDn and an interface (IF) die 601 of the memory device 300 may correspond to the core dies CDs and the IF die 101 of the memory device 100.

The stacked core dies CD0-CDn are coupled with each other and with the IF die 601 via a plurality of TSVs 602. The TSVs 602 are used for data and signal transmission among the multiple core dies and the IF die 601. In some embodiments, each CD of the memory device 600 may include the same elements and configuration as the command and address decoder 102, the data input and output controller 103, the column decoder 104, and the memory array 105 of the memory device 100.

As with the example of FIG. 1B, the core dies CDs receive, among others, a column enable clock ColEn, a column command and address signal CA, and a read clock Rclk from the IF die 601 through the TSVs 602. Rclk controls data output of the core dies CDs to the TSVs 602 for a data read operation. Rclk control is commonly shared among the multiple core dies CDs. ColEn and CA includes information for identifying which CD to be selected and enabled for the data read operation responsive to Rclk.

In the example of FIG. 6B, each core die CD includes an SS decoder 603, an SS first-in first-out (FIFO) circuit or memory (may be referred to as an SS FIFO) 604 coupled to the SS decoder 603, an aligner delay circuit 605 coupled to the SS FIFO 604, and an output control circuit 606 coupled to the aligner delay circuit 605, and a data output circuit 607 coupled to the aligner delay circuit 605 and the output control circuit 606. Each core die CD also includes a clock buffer 611 coupled to the SS FIFO 604 and the aligner delay circuit 605 and a buffer 612 coupled to the aligner delay circuit 605 and the data output circuit 607. Although not fully depicted, all stacked CDs have the same or substantially the same circuit configuration.

The data output circuit 607 includes a data FIFO circuit (may be referred to as a data FIFO) 608 coupled to a read and write bus (RWBUS), an output data latch 609 coupled to the data FIFO 608, and an output data buffer 610 coupled to the output data latch 609 at its input node and to the TSV 602 at its output node. The TSV 602 may include one or more TSVs. The RWBUS may include one or more RWBUSs. Data (RdData) read from a memory array or a memory cell of the core die CD are transmitted through RWBUS to the data FIFO 608. The data FIFO 608 stores the received RdData. The output data latch 609 is also coupled to the aligner delay circuit 605. The output data buffer 610 is also coupled to the output control circuit 606 at another input terminal. RdData stored in the data FIFO 608 passes through the output data latch 609 and the output data buffer 610 and is output to the TSV 602. This output of RdData from the enabled CD is controlled based on RclkTx and RdTxEn as well as Rclkrst, which are generated by the aligner delay circuit 605 and the output control circuit 606, in response to Rclk received from the IF die 601 and SS decoded by the SS decoder 603 and stored at the SS FIFO 604.

In some embodiments, the SS decoder 603 may be included in the command and address decoder 102 in the core die CD of the memory device 100. In some embodiments, the SS FIFO 604, the aligner delay circuit 605, the output control circuit 606, and the data output circuit 607 (including the data FIFO 608, the output data latch 609, and the output data buffer 610) may be included in the data input and output controller 103 in the core die CD of the memory device 100. In some embodiments, the SS FIFO 604, the aligner delay circuit 605, and the output control circuit 606 may be at least part of or constitute a control circuit block. The data output circuit 607 may include a plurality of data output circuits (herein may be referred to as DQs).

In a similar manner to the embodiment illustrated in FIG. 4, the plurality of data output circuits DQs (each of which may correspond to the data output circuit 607) are arranged in a matrix, and various signals output from the control circuit block (which may include, among others, the SS FIFO 604, the aligner delay circuit 605, and the output control circuit 606) are distributed to the corresponding DQs through a tree-form path. The signals from the control circuit block are used for controlling the data output from DQs to TSVs and are generated in response to signals, such as a read clock signal Rclk (for example, Rclk illustrated in FIG. 1B), received from an IF die, such as the IF die 101/601. The generated signals may include, but may not be limited to, RclkTx and RdTxEn as well as Rclkrst illustrated in FIG. 6B, which will be described in detail below.

Referring back to FIG. 6B, the ColEn and CA signals are decoded by the SS decoder 603 to generate a slice select (or core die select) signal SS that identifies which CD to be selected and enabled for the data read operation responsive to the read clock Rclk. In some embodiments, the SS decoder 603 may be included in the command and address decoder 102 of FIG. 1B, and the SS signal may correspond to the SS signal output from the command and address decoder 102. The SS signal output from the SS decoder 603 is stored at the SS FIFO 604 together with a column enable clock Sclk. The stored SS signal may be referred to as SS_fifo herein. In some embodiments, the Sclk clock may correspond to the Sclk_ColEn clock output from the command and address decoder 102. SS_fifo is provided to the clock buffer 611 and/or the output control circuit 606. SS_fifo may be used in providing RclkTx by the aligner delay circuit 605, and providing RdTxEn and Rclkrst by the output control circuit 606, and used to determine whether the transmitted read clock Rclk is valid or not for each core die CD.

In response to SS_fifo and Rclk, the output control circuit 606 generates an output enable signal RdTxEn in either a high state or a low state. RdTxEn as a state signal controls the enable and disable states of the output data buffer 610 of the data output circuit 607. For example, when RdTxEn is high, the output data buffer 610 is turned on to output RdData to the corresponding TSV 602 through a node 613. The node 613 is coupled to the output data buffer 610 and the TSV 602. When RdTxEn is low, the output data buffer 610 is turned off to cause the node 613 to be in a High-Z state so that no RdData is output to the TSV 302 from the selected CD. Hence, for that CD, TSV data output is disabled. Subsequently, for another or next selected CD, TSV data output is enabled. For such disable control of the TSV data output, RdTxEn may be referred to as a reset signal of the output data buffer 610. The state of RdTxEn for each of multiple core dies is controlled to avoid conflict of data output to the shared TSVs 602 among the multiple core dies while achieving the seamless TSV data transmission.

The output control circuit 606 also generates a reset signal Rclkrst of the output data latch 609 in response to SS_fifo and Rclk. Rclkrst is a pulse signal. When the pulse is high, it resets the output data latch 609 to low. This causes the output data buffer 610 to be disabled. The disable control of the output data buffer 610 corresponds to a high/rising edge of the Rclkrst pulse signal. The high/rising edge of the pulse signal is less affected by BTI degradation than the low/falling edge. Therefore, even if there is BTI degradation, an overlap between a disable timing of a current core die and an enable timing of a next core die can be avoided, and hence there will be no conflict of data transfer through the shared TSVs among the multiple core dies. The disable/reset control of the output data buffer 610 by RdTxEn and the disable/reset control of the output data latch 609 and hence the output data buffer 610 by Rclkrst will be described in more detail below.

Figures 7A, 7B:
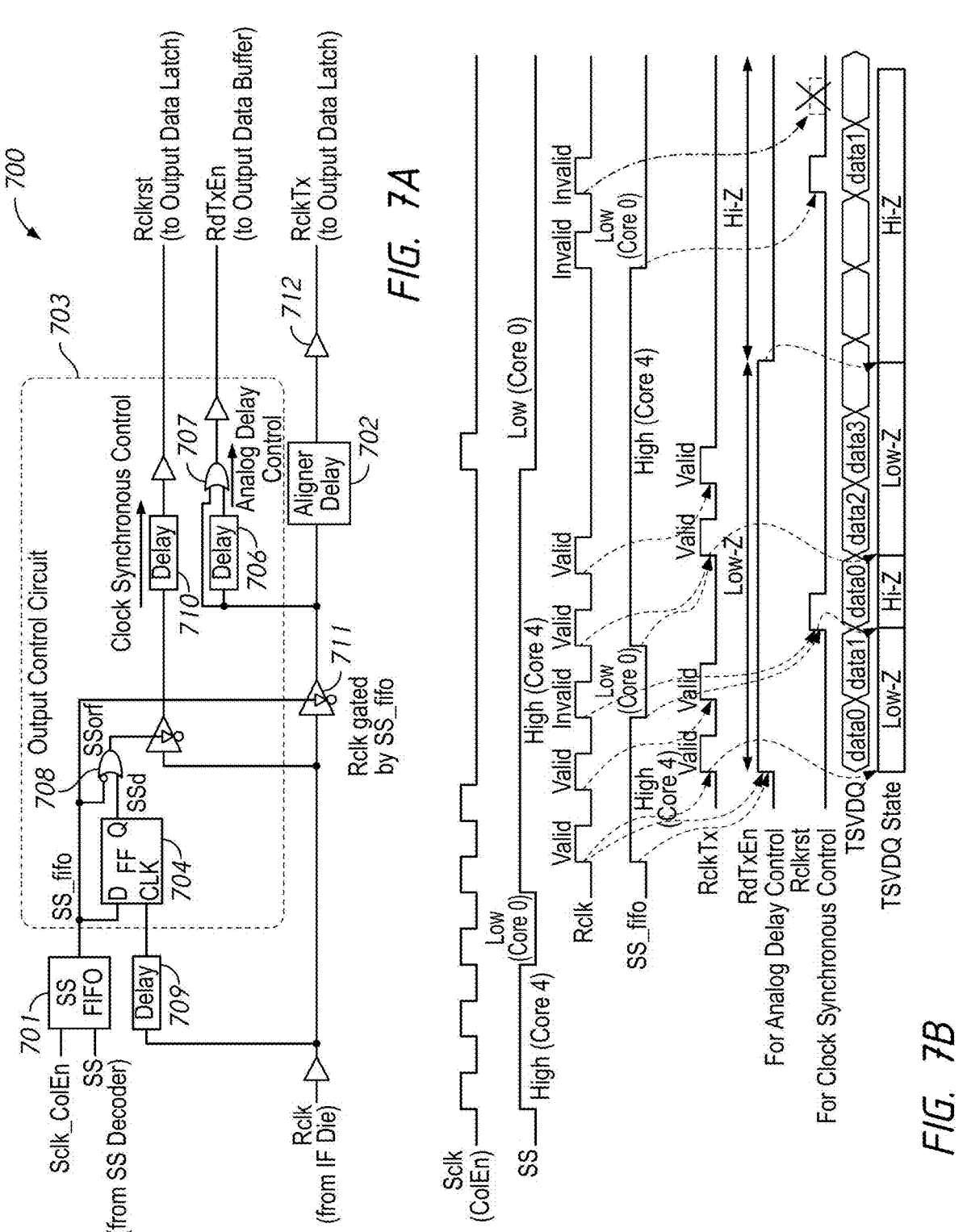
FIG. 7A is a circuit diagram of at least part of an example control circuit block according to an embodiment of the disclosure.
FIG. 7B is a timing diagram of various signals according to an embodiment of the disclosure.

FIG. 7A is a circuit diagram of at least part of an example control circuit block 700 according to an embodiment of the disclosure. FIG. 7B is a timing diagram of various signals according to an embodiment of the disclosure. The control circuit block 700 may correspond to the control circuit block 401 of FIG. 4. In some embodiments of the disclosure, the control circuit block 700 is included in the core dies CDs of FIG. 6B. The control circuit block 700 includes an SS FIFO 701, an aligner delay circuit 702, and an output control circuit 703, which may correspond to the SS FIFO 604, the aligner delay circuit 605, and the output control circuit 606 of FIG. 6B, respectively. The control circuit block 700 also includes a buffer 711 coupled to the SS FIFO 701 and the aligner delay circuit 702 and a buffer 712 coupled to the aligner delay circuit 702 and an output data latch. The buffers 711 and 712 may correspond to the buffers 611 and 612, respectively, in FIG. 6B. The timing diagram of FIG. 7B shows the case where Core 4 is selected and enabled (High SS_fifo) for the data output TSVDQ and is disabled when Core 0 is selected (Low SS_fifo). Core 4 and Core 0 may correspond to those among the plurality of core dies illustrated in FIGS. 2A and 2B, for example.

In the control circuit block 700, when SS_fifo stored at the SS FIFO 701 is in a high state, Rclk received from an IF die (such as the IF die 601 in FIGS. 6A and 6B or the IF die 101 in FIG. 1B) through an TSV (such as the TSV 602 in FIG. 6B) is provided to the aligner delay circuit 702. The aligner delay circuit 702 in turn generates and provides RclkTx to an output data latch (such as the output data latch 609 of the data output circuit 607 in FIG. 6B). As illustrated in FIG. 7B, when SS_fifo is in a high state for Core 4, which is selected and enabled for TSVDQ, in response to the valid Rclk signals, RclkTx turns high.

Unlike the output control circuit 503 of the control circuit block 500 in FIG. 5A, the output control circuit 703 of the control circuit block 700 generates not just RdTxEn but also Rclkrst, which are provided through separate routes to an output data latch (such as the output data latch 609 of the data output circuit 607 in FIG. 6B). The output control circuit 703 includes a delay circuit 706 and an OR logic gate 707 for the RdTxEn route. The output control circuit 703 includes a flip-flop (FF) register 704, an OR logic gate 708, and a delay circuit 710 for the Rcklrst route. The RdTxEn route is for analog delay control. The Rcklrst route is for clock synchronous control.

In the RdTxEn analog delay control route, Rclk is provided to the delay circuit 706 and one input terminal of the OR logic gate 707. The output terminal of the delay circuit 706 is provided to another input terminal of the OR logic gate 707. The output of the OR logic gate 707 is RdTxEn as a state signal. As illustrated in FIG. 7B, RdTxEn turns to a high state in response to the high/rising edges of SS_fifo (High_Core 4) and Rclk (Valid). This turns on the output data buffer and causes the TSVDQ state to turn Low-Z/ enabled for Core 4. RdTxEn then turns to a low state in response to a delayed signal of the current (or previous) Rclk generated at the delay circuit 706. The delayed signal is generated at a predetermined period of time elapsed from at least one of the rising and falling edges of the current (or previous), valid Rclk signal. The falling edge of the RdTxEn signal is created by the delayed Rclk signal. Accordingly, while the start of the high state of RdTxEn is synchronous with the high/rising edges of SS_fifo and Rclk, the end of the high state or the start of the low state of RdTxEn is controlled by the analog delay irrespective of the falling edges of SS_fifo and Rclk. The low RdTxEn signal turns off or resets the output data buffer and causes the TSVDQ state to turn Hi-Z/disabled for Core 4. Accordingly, RdTxEN in the low state as a reset signal of the output data buffer is used for disable timing control of the TSV data output from Core 4. While the TSV data output from Core 4 is disabled, the TSV data output from Core 0 is enabled.

In the Rclkrst clock synchronous control route, SS_fifo and Rclk are provided to a data input and a clock input of the FF register 704, respectively. Rclk goes through a delay circuit 709 before input to the FF register 704. The output (SSd) of the FF register 704 is provided to one input of the OR logic gate 708. SS_fifo is also provided to another input of the OR logic gate 708. The output (SSorf) of the OR logic gate 708 is used to gate Rclk, which is, when SSorf is high, provided to the delay circuit 710 to generate Rclkrst as a pulse signal. As illustrated in FIG. 7B, the Rclkrst pulse is responsive to the low/falling edge of SS_fifo and the high/ rising edge of Rclk (Invalid). The output data latch is then reset and turns off the output data buffer, causing the TSVDQ state to transit to Hi-Z/disabled from Low-Z/en- abled. Accordingly, Rclkrst as a reset signal of the output data latch is used for disable timing control of the TSV data output from Core 4.

Figures 8A, 8B:
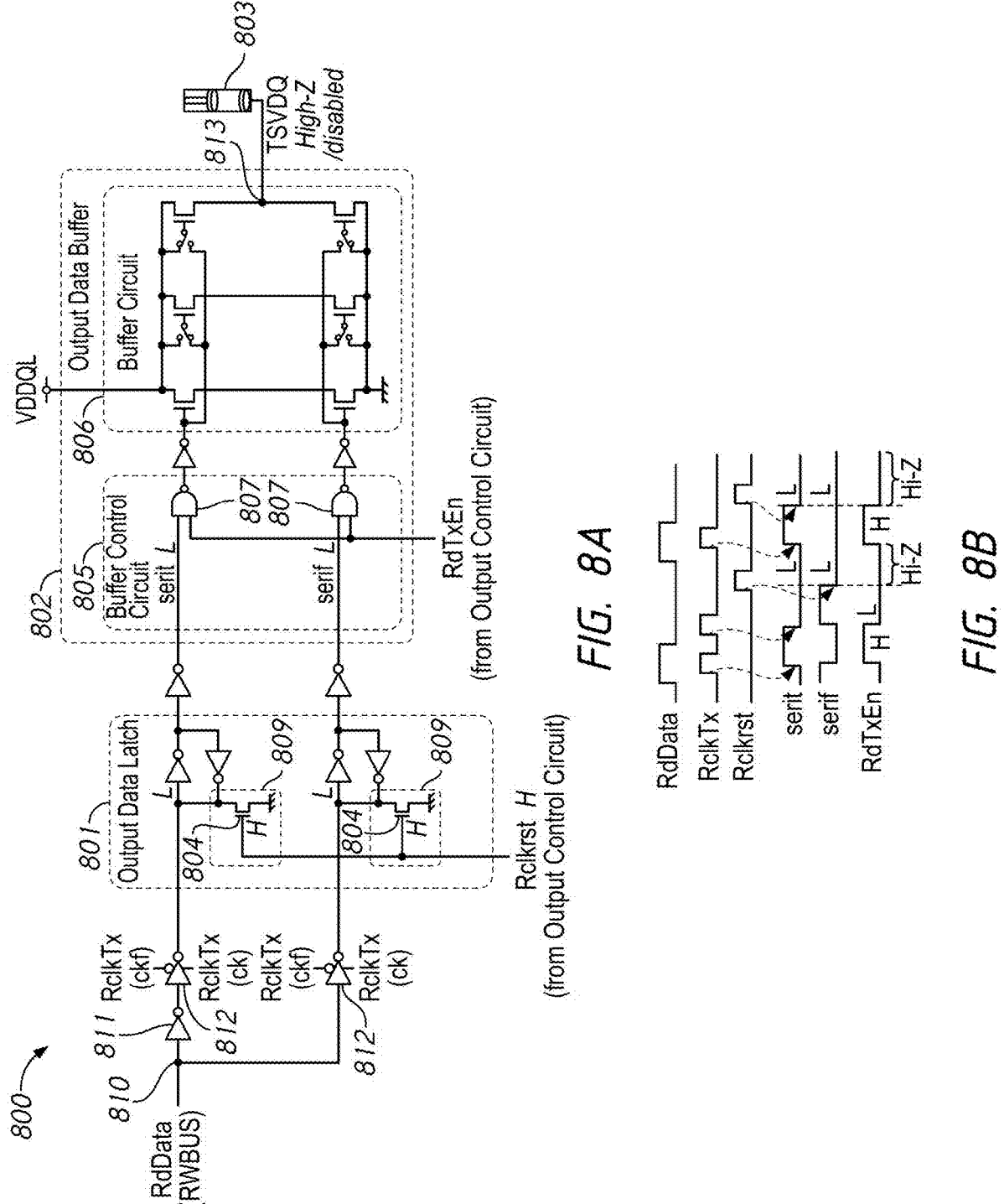
FIG. 8A is a circuit diagram of at least part of an example data output circuit according to an embodiment of the disclosure.
FIG. 8B is a timing diagram of various signals according to an embodiment of the disclosure.

FIG. 8A is a circuit diagram of at least part of an example data output circuit 800 according to an embodiment of the disclosure. FIG. 8B is a timing diagram of various signals according to an embodiment of the disclosure.

The data output circuit 800 may correspond to the data output circuit 607 in FIG. 6B. The data output circuit 800 may be coupled to the control circuit block 700. The data output circuit 800 includes a data output latch 801 and an output data buffer 802, which may correspond to the output data latch 609 and the output data buffer 610 in FIG. 6B, respectively.

The data output circuit 800 further includes a data splitter 810 to provide first read data and second read data in parallel based on the common read data, RdData. The first read data and second read data are complementary. In the example configuration, the data splitter 810 includes a node on RWBUS from which RWBUS and hence RdData split into two paths. The data splitter 810 may include other circuit elements to split RdData into the first and second read data and send them to the split paths.

The first and second read data are provided to the output data latch 801. The first and read data may go through some NOT logic gates (or inverters) 811 and 812 provided on the respective data paths before entering the output data latch 801. For example, one of the split RdData (one of the first and second read data) may go through the double inverters 811 and 812 on one data path and stay as true read data, while another of the split RdData (another of the first and second read data) may go through the single inverter 812 on the other data path and turn to false read data.

The output data latch 801 includes latch circuit configu- rations on the respective paths to latch the first read data and the second read data, respectively. Each latch circuit con- figuration includes, for example, some NOT logic gates (or inverters) configured to latch data. The latch circuit con- figuration is not limited to the illustrated configuration. The output data latch 801 also includes output disable control circuits 809 coupled to the respective latch circuit configu- rations. Each output disable control circuit 809 includes a transistor 804 added to the corresponding latch circuit configuration. Each transistor 804 receives Rclkrst as a reset signal from an output enable control circuit (such as the output control circuit 703 of the control circuit block 700 in FIG. 7A). The transistor 804 may be a MOSFET. Rclkrst is provided to a gate of each transistor 804. In the example configuration, the output disable control circuit 809 or the transistor 804 is illustrated as part of the output data latch 801. In some embodiments, the output disable control circuit 809/the transistor 804 may not be included in the output data latch 801. The output disable control circuit 809/transistor 804 may be a separate circuit from the output data latch 801.

The output data buffer 802 includes a buffer control circuit 805 and a buffer circuit 806. The buffer control circuit 805 is coupled to the output data latch 801 and the buffer circuit 806 at its input terminals and output terminals, respectively. The buffer control circuit 805 includes buffer control circuit configurations on the respective data paths to receive the first read data and the second read data, respectively. Each buffer control circuit configuration includes, for example, a NAND logic gate 807 configured to control the buffer circuit 806. The buffer control circuit configuration is not limited to the illustrated configuration. The NAND logic gates 807 receive the first read data and the second read data output from the output data latch 801 at input terminals, respec- tively. The NAND logic gates 807 also receive RdTxEn from the output enable control circuit at other input termi- nals.

The buffer circuit 806 includes buffer circuit configurations on the respective data paths to receive the first read data and the second read data output from the buffer control circuit 805, respectively. Each buffer circuit configuration includes some transistors and switches configured to buffer data. The buffer circuit configuration is not limited to the illustrated configuration. The buffer circuit 806 is coupled to the TSV 803 through a node 813. The node 813 may correspond to the node 613 in FIG. 6B. The output of the buffer circuit 806 is provided to one or more TSVs 803, which are shared among the multiple core dies. The buffer circuit 806 drives the one or more TSVs 803 based on the received first and second read data.

In this circuit configuration, when the high RdTxEn signal is provided to the buffer control circuit 805, the buffer control circuit 805 turns high and the buffer circuit 805 turns on to output RdData to the TSV 803 through the node 813. The node 813 and hence the TSVDQ state becomes Low-Z for the TSV data output. When the high Rclkrst pulse is provided to the gates of the transistors 804, the output data latch 801 is reset, causing the input signals (serit and serif) to the NAND logic gates 807 of the buffer control circuit 805 to be low/High-Z. Therefore, even if the high RdTxEn signal is provided to the NAND logic gates 807 (see FIG. 7B), the buffer circuit 806 is disabled to halt the output of RdData to the TSV 803. Accordingly, to cause the node 813 and hence the TSVDQ state to be Hi-Z, the polarity of the output data latch 801 (or the output data latch 609 in FIG. 6B) is controlled with Rclkrst which is provided to the gates of the transistors 804 serving as the output disable control circuits 809 in the output data latch 801. The disable state of the output data buffer 802 (or the output data circuit 607 in FIG. 6B) is controlled by the high pulse of Rclkrst, regardless of the state of RdTxEn. The Rclkrst clock synchronous control is independent from the RdTxEn analog delay control. Such control eliminates the possible BTI degradation effect on the RdTxEn state signal, and consequently, avoids the data transfer conflict on the TSV output paths shared among the multiple core dies. In some embodiments, these two types of independent timing control may be performed by or in a test mode.

According to the present embodiments as described above, two types of disable/reset timing control of the TSV data output are introduced. One is the clock synchronous control that disables the data output buffer by the pulse signal Rclkrst as the reset signal of the data output latch. Another is the analog delay control that disables the data output buffer by the state signal RdTxEn based on a predetermined delay time as the reset signal of the data output buffer. These two types of control achieve a precise output disable control at the data output buffer of one core to prevent conflict with output enable control at the data output buffer of another core. This realizes seamless TSV data transition among the multiple core dies through the shared TSVs and reduction of leakage current of the data output buffer without being influenced by BTI degradation.

In some embodiments of the disclosure, referring back to FIG. 7B, there may be an instance where two invalid Rclk signals are consecutively generated without a valid Rclk signal between the first and second invalid Rclk signals. As already described, one Rclkrst pulse is generated in response to the invalid Rclk to reset the data output latch and causes the data output buffer to turn off and render the TSVDQ state Hi-Z. If there is another invalid Rclk immediately after the first invalid Rclk while in the Hi-Z state, there will be unnecessary current consumption. In order to suppress such current consumption, it may be controlled to not generate the Rclkrst pulse in response to the second invalid Rclk when there is no valid Rclk signal between the first and second invalid Rclk signals.

Figures 9A, 9B:
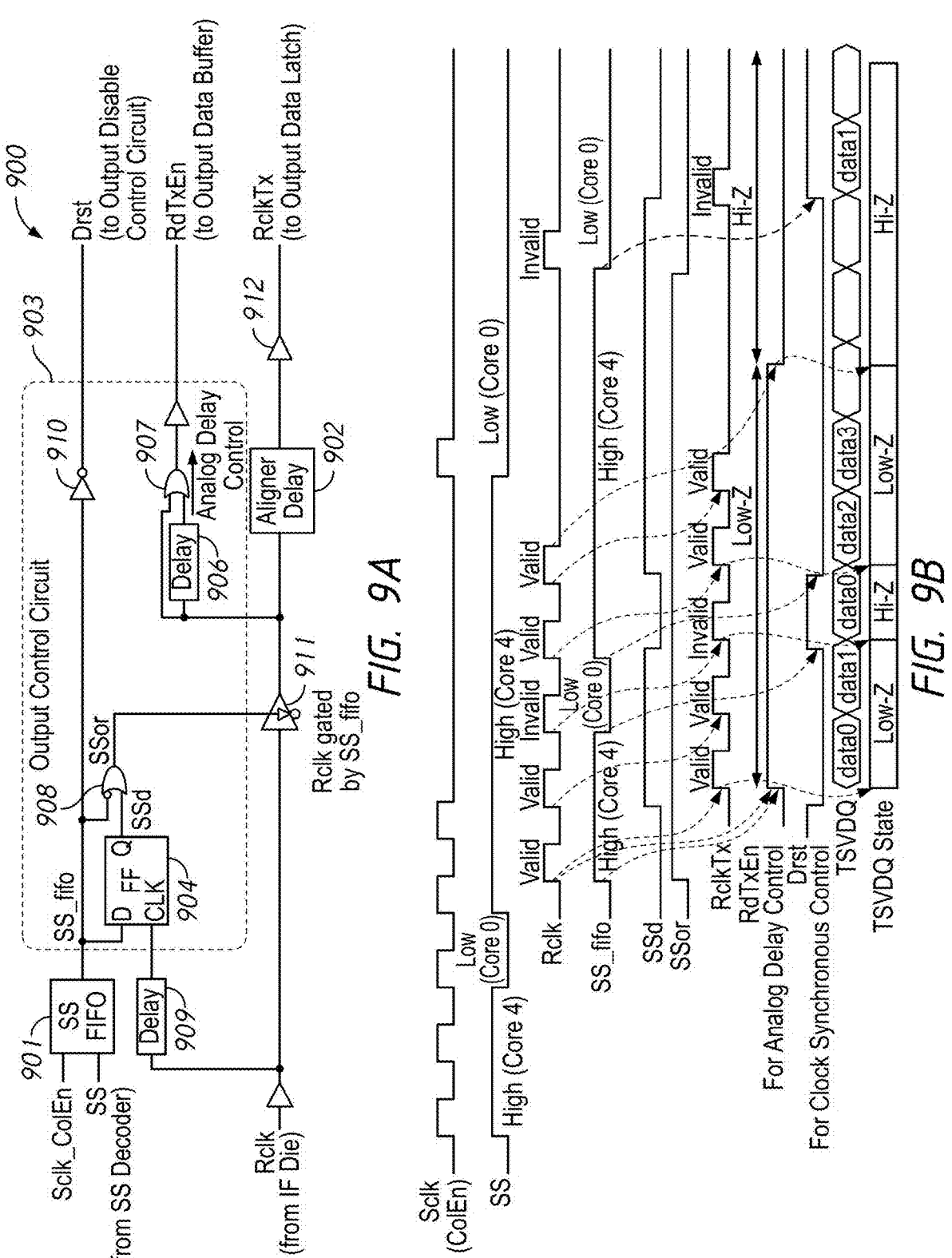
FIG. 9A is a circuit diagram of at least part of an example control circuit block according to an embodiment of the disclosure.
FIG. 9B is a timing diagram of various signals according to an embodiment of the disclosure.
Figures 10A, 10B:
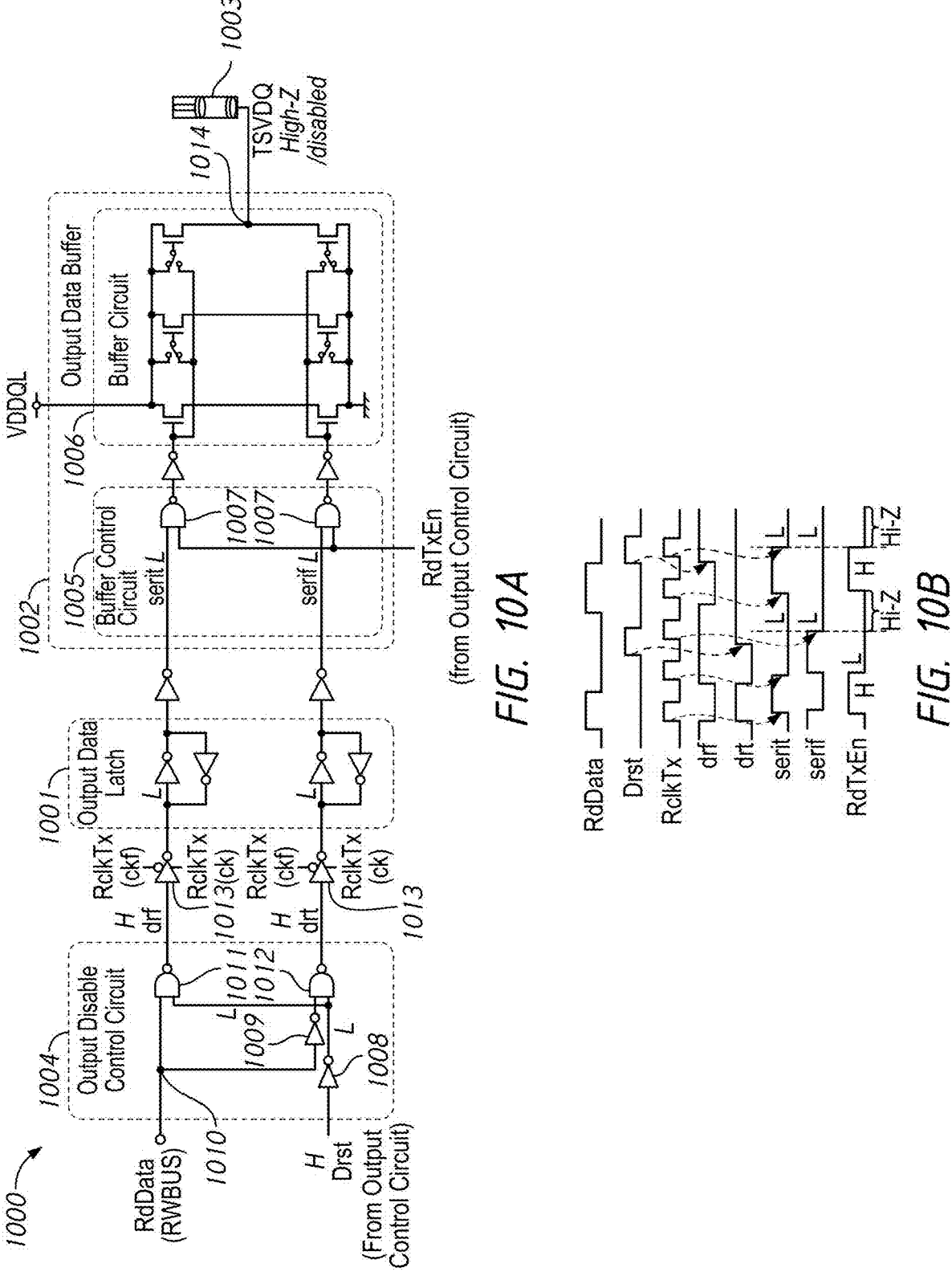
FIG. 10A is a circuit diagram of at least part of an example data output circuit according to an embodiment of the disclosure.
FIG. 10B is a timing diagram of various signals according to an embodiment of the disclosure.

FIG. 9A is a circuit diagram of at least part of an example control circuit block 900 according to an embodiment of the disclosure. FIG. 9B is a timing diagram of various signals according to an embodiment of the disclosure. FIG. 10A is a circuit diagram of at least part of an example data output circuit 1000 according to an embodiment of the disclosure. FIG. 10B is a timing diagram of various signals according to an embodiment of the disclosure. The embodiment in FIGS. 9A-9B and 10A-10B utilizes an output disable control scheme different from that of the embodiment in FIGS. 7A-7B and 8A-8B. The output disable control scheme of the present embodiment uses a reset signal Drst, as a state signal for clock synchronous control, which controls the polarity of the read data RdData before RdData enters the data output latch.

The control circuit block 900 may correspond to the control circuit block 401 of FIG. 4. In some embodiments of the disclosure, the control circuit block 900 is included in the core dies CDs of FIG. 6B. The control circuit block 900 includes an SS FIFO 901, an aligner delay circuit 902, and an output control circuit 903, which may correspond to the SS FIFO 604, the aligner delay circuit 605, and the output control circuit 606 of FIG. 6B, respectively. The SS FIFO 901 and the aligner delay circuit 902 may also correspond to the SS FIFO 701 and the aligner delay circuit 702 of FIG. 7B, respectively. The output control circuit 903 includes an FF register 904, a delay 906, an OR logic gate 907, and an OR logic gate 908, which may correspond to the FF register 704, the delay circuit 706, the OR logic gate 707, and the OR logic gate 708 of the output control circuit 703, respectively. The output control circuit 903 also includes a NOT logic gate (or an inverter) 910 coupled to the SS FIFO 901. The control circuit block 900 also includes a buffer 911, which is coupled to the SS FIFO 901 or the OR logic gate 908 and the aligner delay circuit 902, and a buffer 912, which is coupled to the aligner delay circuit 902 and an output data latch. The buffers 911 and 912 may correspond to the buffers 611 and 612, respectively, in FIG. 6B. The buffers 911 and 912 may correspond to the buffers 711 and 712, respectively, in FIG. 7B.

The data output circuit 1000 may correspond to the data output circuit 607 in FIG. 6B. The data output circuit 1000 may be coupled to the control circuit block 900. The data output circuit 1000 includes an output data latch 1001 and an output data buffer 1002, which may correspond to the output data latch 801 and the output data buffer 802 of the data output circuit 800 of FIG. 8A. The output data buffer 1002 includes a buffer control circuit 1005 and a buffer circuit 1006, which may correspond to the buffer control circuit 805 and the buffer circuit 806 of the output data buffer 802, respectively. The buffer circuit 1006 is coupled to a TSV (or one or more TSVs) 1003 through a node 1014. The node 1014 may correspond to the node 813 in FIG. 8A or the node 613 in FIG. 6B.

Similarly to the data output circuit 800, the data output circuit 1000 further includes a data splitter 1010 to provide first read data and second read data in parallel based on the common read data, RdData. The first read data and second read data are complementary. As one example, the first read data may be true read data, and the second read data may be false read data. In the example configuration, the data splitter 1010 includes a node on RWBUS from which RWBUS and hence RdData split into two paths. The data splitter 1010 may include other circuit elements to split RdData into the first and second read data and send them to the split paths.

The data output circuit 1000 of the present embodiment further includes an output disable control circuit 1004 different from the output disable control circuits 809 of the data output circuit 800. The output disable control circuit 1004 is arranged on RWBUS and coupled to the input side of the output data latch 1001. In the example configuration, the data splitter/node 1010 is illustrated as part of the output disable control circuit 1004. The output disable control circuit 1004 may thus be referred to as a data splitter that includes the node 1010 on the RWBUS and other circuit elements such as logic gates on the split data paths.

The output disable control circuit 1004 includes a NOT logic gate (or an inverter) 1008, a NOT logic gate (or an inverter) 1009, and a pair of NAND logic gates 1011 and 1012. The NAND logic gates 1011 and 1012 are provided on the respective data paths. The NOT logic gate 1009 is provided on one of the data paths coupled to the node 1010 and the NAND logic gate 1012. In the example configuration, the NOT logic gate 1008 is illustrated as part of the output disable control circuit 1004. In some embodiments, the NOT logic gate 1008 may be separate from the output disable control circuit 1004.

An input terminal of the NOT logic gate 1008 is coupled to the Drst clock synchronous control route of the output control circuit 903 to receive Drst. One (first) of input terminals of the NAND logic gate 1011 is coupled to one of the split RWBUS to receive one of the split RdData (one of the first and second read data). An input terminal of the NOT logic gate 1009 is coupled to another of the split RWBUS to receive another of the split RdData (another of the first and second read data). An output terminal of the NOT logic gate 1008 is coupled to one (first) of input terminals of the NAND logic gate 1012 and also to another (second) of the input terminals of the NAND logic gate 1011. An output terminal of the NOT logic gate 1009 is coupled to another (second) of the input terminals of the NAND logic gate 1012. The output terminals of the NAND logic gates 1011 and 1012 are coupled to the input side of the output data latch 1001 where the first and second read data are received and latched on the respective paths. The first and second read data output from the output disable control circuit 1004 may go through some NOT logic gates (or inverters) 1013 provided on the respective data paths before entering the output data latch 1001. The output disable/Hi-Z control operation by the output disable control circuit 1004 using Drst will be described in detail later.

Similarly to FIG. 7B, the timing diagram of FIG. 9B shows the case where Core 4 is selected and enabled (High SS_fifo) for the data output TSVDQ and is disabled when Core 0 is selected (Low SS_fifo). Core 4 and Core 0 may correspond to those among the plurality of core dies illustrated in FIGS. 2A and 2B, for example. The timing diagram of FIG. 10B shows the Drst state signal instead of the Rclkrst pulse signal in FIG. 8B.

In the embodiment of FIGS. 9A-9B, RdTxEn generated at the output control circuit 903 is the same as RdTxEn generated at the corresponding circuits in the control circuit block 700 of the embodiment of FIGS. 7A-7B. Therefore, the descriptions thereof are omitted herein. RclkTx generated at the aligner delay circuit 902 is the same as RclkTx generated at the corresponding circuits in the control circuit block 700, except for one invalid RclkTx pulse generated between two valid RclkTx pulses. This invalid RclkTx pulse is described in detail later.

Unlike the embodiment of FIG. 7A, in the Drst clock synchronous control route according to the present embodiment, as shown in FIG. 9A, SS_fifo from SS FIFO 901 is input to the NOT logic gate (inverter) 910 of the output control circuit 903, and the inverted signal is output to the output disable control circuit 1004 as the reset signal Drst. As illustrated in FIG. 9B, Drst is the inverted signal of SS_fifo. In the output disable control circuit 1004, one of the split RdData on one of the split path from the node 1010 is provided to the first input terminal of the NAND logic gate 1011 and another of the split RdData on another of the split path from the node 1010 to the input terminal of the NOT logic gate 1009. Drst from the output control circuit 903 is provided to the input terminal of the NOT logic gate 1008. The output of the NOT logic gate 1008 is provided to the first input terminal of the NAND logic gate 1012 and also to the second input terminal of the NAND logic gate 1011. To the second input terminal of the NAND logic gate 1012, the output of the NOT logic gate 1009 is provided. The output signals drf and drt of the respective NAND logic gates 1011 and 1012 as the polarity controlled RdData as described in detail below are provided to the corresponding input terminals of the output data latch 1001.

In this circuit configuration, Drst controls the polarity of RdData on RWBUS to change RdData in the output data latch 1001 to a low/Hi-Z state. For example, when Drst turns high as SS_fifo turns low (see FIG. 9B), Drst resets the output disable control circuit 1004 to provide the output signals (drf and drt) in a high state. The high (H) Drst signal is inverted to low (L) at the NOT logic gate (inverter) 1008, which is then input to the NAND logic gates 1011 and 1012 while the split RdData are input to the NAND logic gate 1011 on one route and to the NAND logic gate 1012 through the NOT logic gate (inverter) 1009 on another route, respectively (see FIG. 10A). The NAND logic gates 1011 and 1012 outputs the high (H) drf and drt signals irrespective of the states of the RdData input to the output disable control circuit 1004. This way, Drst controls the polarity of RdData 1001, and resets the output disable control circuit/data splitter 1004.

The high drf and drt signals are input to and inverted at NOT logic gates/inverters 1013 provided between the output disable control circuit 1004 and the output data latch 1001, and then, in the low (L) state, enter the output data latch 1001 (see FIG. 10A). At the same time, one invalid RclkTx pulse is provided to the output data latch 1001 through the NOT logic gates 1013 (see FIGS. 9B and 10A). In the embodiment of FIGS. 7A-7B and 8A-8B, if SS_fifo is in the low state which indicates that Core 4 is not selected, RclkTx for Core 4 is not generated after the valid RclkTx clock as shown in FIG. 7B. In the present embodiment of FIGS. 9A-9B and 10A-10B, the invalid RclkTx pulse is generated after the valid RclkTx pulse as shown in FIG. 9B, based on both the information (SSd) stored at and provided from the FF register 904 indicating that the previous RclkTx was valid and the information (SS_fifo) stored at and provided from the SS FIFO 901 indicating that the current cycle is invalid for Core 4.

In response to the resetting of the output disable control circuit/data splitter 1004 by Drst and the Invalid RclkTx pulse triggered by SS_fifo and SSd, the output data latch 1001 turns low, the output data buffer 1002 is disabled, and the node 1014 and hence the TSVDQ state transitions to Hi-Z. Accordingly, the Hi-Z/disable control corresponds to high/rising edges of the reset signal Drst and the invalid signal RclkTx. The high/rising edge of the signal is less affected by BTI degradation than the low/falling edge.

Therefore, even if there is BTI degradation, an overlap between a disable timing of a current core die and an enable timing of a next core die can be avoided, and hence there will be no conflict of data transfer through the shared TSVs among the multiple core dies.

Figure 11:
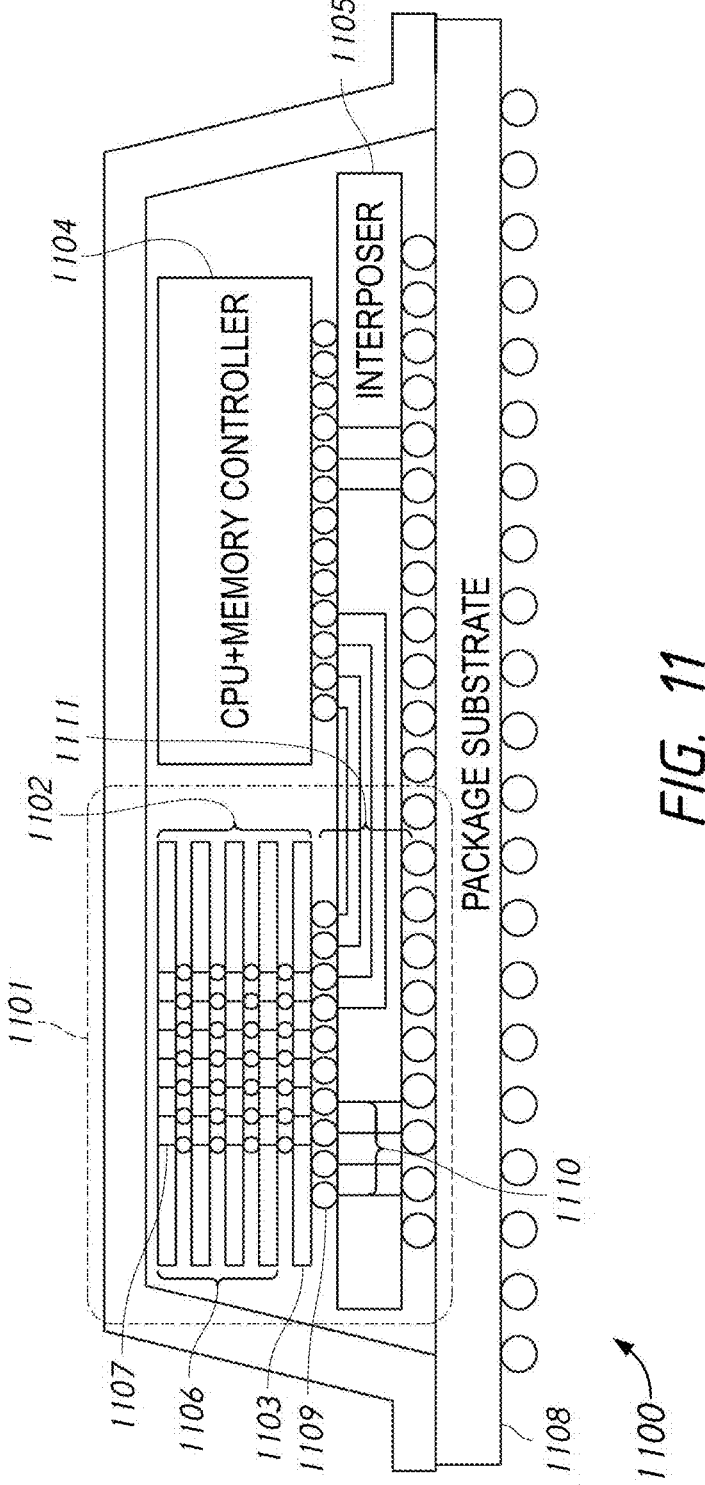
FIG. 11 depicts a schematic configuration of an example semiconductor system according to an embodiment of the disclosure.

FIG. 11 depicts a schematic configuration of an example semiconductor system 1100 according to an embodiment of the disclosure. The semiconductor system 1100 includes a semiconductor memory device 1101 in an embodiment of the disclosure. In some embodiments of the disclosure the semiconductor memory device 1101 may include the memory device 100, 300, or 600. The semiconductor system 1100 may also include a central processing unit (CPU) and memory controller 1104, which may be a controller chip, on an interposer 1105 on a package substrate 1108. The interposer 1105 may include one or more power lines 1110 which may supply power supply voltage from the package substrate 1108. The interposer 1105 may include a plurality of channels 1111 that may interconnect the CPU and memory controller 1104 and the semiconductor memory device 1101. The semiconductor memory device 1101 may be a dynamic random access memory (DRAM). The memory controller 1104 may provide a clock signal, a command signal, and may further transmit and receive data signals. The plurality of channels 1111 may transmit the data signals between the memory controller and the memory device 1101.

The semiconductor memory device 1101 may include a plurality of dies (or chips) 1102 including at least one interface (IF) die (or chip) 1103 and a plurality of memory core dies (or chips) 1106 stacked with each other. The IF die 1103 and the plurality of memory core dies 1106 may corresponds to the IF die 101/301/601 and the core dies CD0-CDn. A number of the memory core dies 1106 may not be limited to four as in the illustrated example, and may be more or fewer as appropriate. Each of the memory core dies 1106 may include a plurality of memory cells and circuitries accessing the memory cells. For example, the memory cells may be DRAM cells. The memory cells may be arranged in array. The semiconductor memory device 1101 may include conductive vias 1107 which couple the IF die 1103 and the memory core dies 1106 by penetrating the IF die 1103 and the memory core dies 1106. The IF die 1103 may be coupled to the interposer 1105 via interconnects 1109. For example, the interconnects 1109 may be microbumps having bump pitches of less than about or less than one hundred microm- eters and exposed on an outside of the IF die 1103. A portion of each of the interconnects 1109 may be coupled to the one or more power lines 1110. Another portion of each of the interconnects 1109 may be coupled to one or more of the channels 1111.

DRAM is merely one example, and the embodiments and the descriptions herein are not intended to be limited to DRAM. Memory devices other than DRAM, such as a static random-access memory (SRAM), a flash memory, an eras- able programmable read-only memory (EPROM), a magne- toresistive random-access memory (MRAM), and a phase- change memory, can also be applied as the semiconductor memory device 1101. Furthermore, devices other than memory, including logic ICs, such as a microprocessor and an application-specific integrated circuit (ASIC), are also applicable as the semiconductor device according to the present embodiments.

Figure 12:
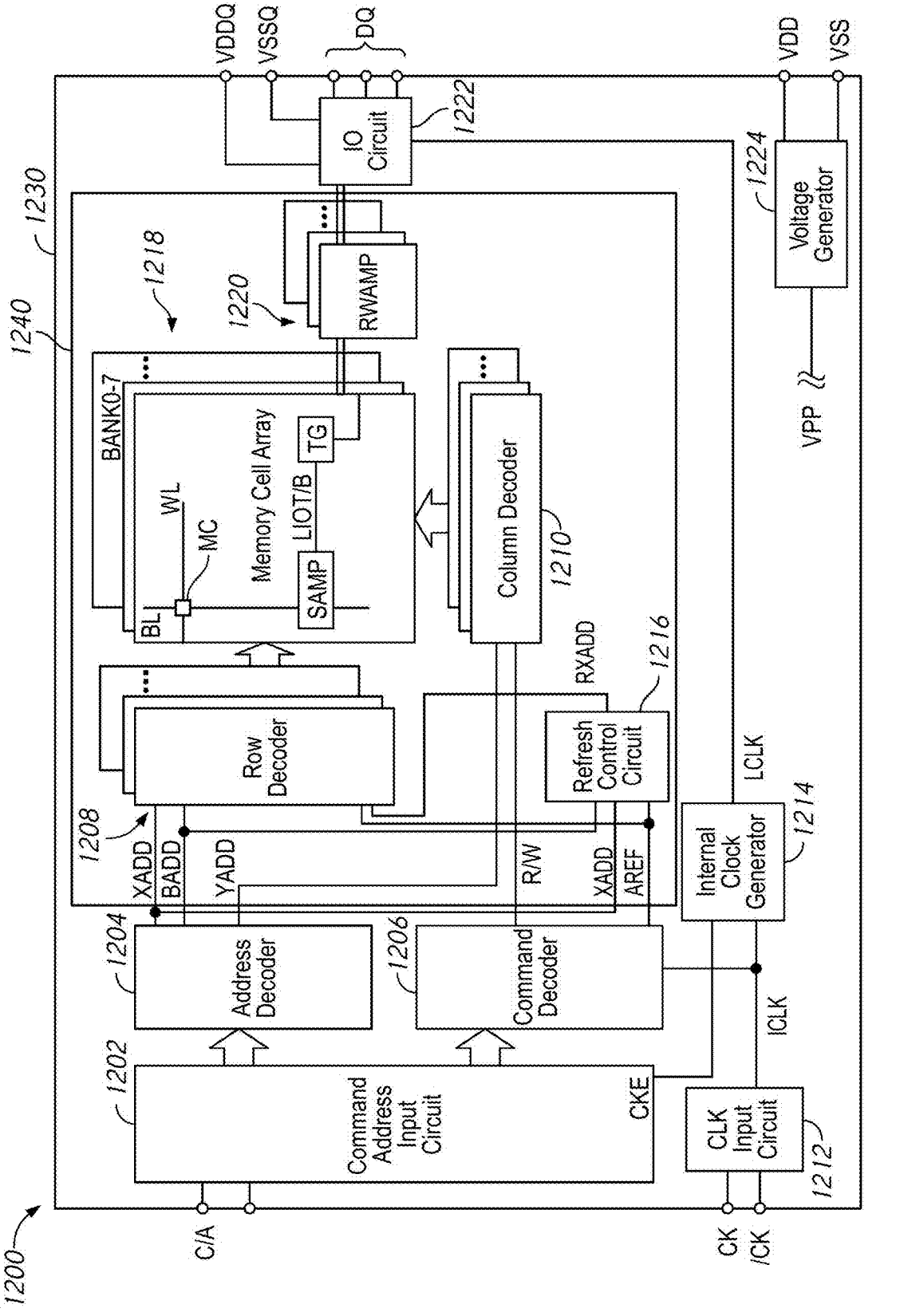
FIG. 12 is a block diagram of an example semiconductor system according to an embodiment of the disclosure.

FIG. 12 is a block diagram of an example semiconductor device 1200 according to an embodiment of the disclosure. The semiconductor device 1200 may be a semiconductor memory device, such as a DRAM device. In some embodi- ments of the disclosure, the semiconductor device 1200 is included in a semiconductor memory device, for example, the semiconductor memory device 1101 of FIG. 11. The DRAM device may include an interface die and a plurality of core dice which are stacked on the interface die. In the example diagram of FIG. 12, certain components are shown located on an interface die 1230, while other components are shown as part of each of a core dice 1240. For the sake of clarity, only a single core die 1240 and its components are shown, however, there may be multiple core dies (e.g., 2, 4, 6, 8, 16, or more) each with similar components to each other. The example semiconductor device 1200 of FIG. 12 shows a particular arrangement of components between the interface die 1230 and the core die 1240, however other arrangements may be used in other embodiments (e.g., a refresh control circuit 1216 may be on the interface die 1230 in some embodiments). For the sake of illustration, the core die 1240 is drawn as a box which is smaller than the interface die 1230, however the core die 1240 and interface die 1230 may have any size relationship to each other. For example, the core die 1240 and interface die 1230 may be approximately the same size.

The semiconductor device 1200 includes a memory array 1218 on each of the core dice 1240. The memory array 1218 is shown as including a plurality of memory banks. In the embodiment of FIG. 12, the memory array 1218 is shown as including eight memory banks BANK0-BANK7. More or fewer banks may be included in the memory array 1218 of other embodiments. Each memory bank includes a plurality of word lines WL, a plurality of bit lines BL, and a plurality of memory cells MC arranged at intersections of the plu- rality of word lines WL and the plurality of bit line BL. The selection of the word line WL is performed by a row decoder 1208 and the selection of the bit lines BL is performed by a column decoder 1210, each of which may also be located on each of the core dice. In the embodiment of FIG. 12, the row decoder 1208 includes a respective row decoder for each memory bank and the column decoder 1210 includes a respective column decoder for each memory bank. The bit lines BL are coupled to a respective sense amplifier (SAMP) of the memory array 1218. Read data from the bit line BL is amplified by the sense amplifier SAMP, and transferred to read/write amplifiers (RWAMPs) 1220 over complementary local data lines (LIOT/B), transfer gate (TG), and comple- mentary main data lines (MIOT/B) which are coupled to RWAMP 1220. Conversely, write data outputted from RWAMP 1220 is transferred to the sense amplifier SAMP over the complementary main data lines MIOT/B, the trans- fer gate TG, and the complementary local data lines LIOT/B, and written in the memory cell MC coupled to the bit line BL.

The semiconductor device 1200 may employ a plurality of external terminals located on the interface die 1230 that include command and address (CA) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals on the interface die 1230 are supplied with external clocks CK and /CK that are provided to an input circuit 1212. The external clocks may be complemen- tary. The input circuit 1212 generates an internal clock ICLK based on the CK and /CK clocks. The ICLK clock is provided to the command decoder 1206 and to an internal clock generator 1214. The internal clock generator 1214 provides various internal clocks LCLK based on the ICLK clock. The LCLK clocks may be used for timing operation of various internal circuits. The internal data clocks LCLK are provided to an input and output (IO) circuit 1222 to time operation of circuits included in the IO circuit 1222, for example, to data receivers to time the receipt of write data.

The internal clocks LCLK may include a read clock (RCLK) which is used to control the timing of read operations, and a write clock (WCLK) which is used to control the timing of write operations. The internal clocks may be passed both to the IO circuit 1222 and to internal components of the core dice 1240 such as RWAMP 1220.

The CA terminals may be supplied with memory addresses. The memory addresses supplied to the CA terminals are transferred, via a command/address input circuit 1202, to an address decoder 104. The address decoder 104 receives the address and supplies a decoded row address XADD to the row decoder 1208 and supplies a decoded column address YADD to the column decoder 1210. The address decoder 104 may also supply a decoded bank address BADD, which may indicate the bank of the memory array 1218 containing the decoded row address XADD and column address YADD. The CA terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to the command decoder 1206 via the command/address input circuit 1202. The command decoder 1206 includes circuits to decode the internal command signals to generate various internal signals and commands for performing operations. For example, the command decoder 1206 may provide a row command signal to select a word line and a column command signal to select a bit line.

The semiconductor device 1200 may receive an access command which is a read command. When a read command is received, and a bank address, a row address and a column address are timely supplied with the read command, read data is read from memory cells in the memory array 1218 corresponding to the row address and column address. The read command is received by the command decoder 1206, which provides internal commands so that read data from the memory array 1218 is provided to RWAMP 1220. The read data is output to outside the semiconductor device 1200 from the data terminals DQ via the IO circuit 1222.

The semiconductor device 1200 may receive an access command which is a write command. When the write command is received, and a bank address, a row address and a column address are timely supplied with the write command, and write data is supplied through the DQ terminals to RWAMP 1220. The write data supplied to the data terminals DQ is written to a memory cells in the memory array 1218 corresponding to the row address and column address. The write command is received by the command decoder 1206, which provides internal commands so that the write data is received by data receivers in the IO circuit 1222. Write clocks may also be provided to the external clock terminals for timing the receipt of the write data by the data receivers of the IO circuit 1222. The write data is supplied via the IO circuit 1222 to RWAMP 1220.

The semiconductor device 1200 may also receive commands causing it to carry out one or more refresh operations as part of a self-refresh mode. In some embodiments, the self-refresh mode command may be externally issued to the semiconductor device 1200. In some embodiments, the self-refresh mode command may be periodically generated by a component of the device. In some embodiments, when an external signal indicates a self-refresh entry command, the refresh signal AREF may also be activated.

The power supply terminals are supplied with power supply potentials VDD and VSS. The power supply potentials VDD and VSS are supplied to an internal voltage generator circuit 1224. The internal voltage generator circuit 1224 generates various internal potentials such as VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the IO circuit 1222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the IO circuit 1222 so that power supply noise generated by the IO circuit 1222 does not propagate to the other circuit blocks.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still falling within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. An apparatus, comprising:
   a plurality of through-silicon vias (TSVs);
   a plurality of core dies stacked with one another, each core
   die of the plurality of core dies including a data output
   circuit coupled to one or more TSVs of the plurality of
   TSVs to output read data to the one or more TSVs, the
   data output circuit including:
   a data splitter configured to provide first read data and
   second read data in parallel based on the read data,
   the first read data and the second read data being
   complementary;
   an output data latch configured to latch the first read
   data and the second read data; and
   an output data buffer configured to receive the first and
   second read data from the output data latch and drive
   the one or more TSVs based on the received first and
   second read data; and
   an output control circuit configured to provide a first reset
   signal to the output data buffer and a second reset signal to one of the data splitter and the output data latch to disable the output of the read data to the one or more TSVs.

2. The apparatus according to claim 1, wherein the output control circuit is configured to provide the second reset signal responsive to a read clock to the output data latch.

3. The apparatus according to claim 2, wherein a high edge of the second reset signal corresponds to a high edge of the read clock.

4. The apparatus according to claim 3, wherein the read clock is an invalid read clock after a previous valid read clock.

5. The apparatus according to claim 2, wherein the second reset signal is provided to a gate of a transistor coupled to inverters of the output data latch to reset the output data latch.

6. The apparatus according to claim 1, wherein the output data buffer includes a buffer control circuit coupled to the output data latch and a buffer circuit coupled to the buffer control circuit and the one or more TSVs, and the first reset signal is provided to the buffer control circuit.

7. The apparatus according to claim 1, wherein the output control circuit is configured to provide the second reset signal responsive to a core die select signal to the data splitter.

8. The apparatus according to claim 7, wherein the second reset signal is an inverted signal of the core die select signal.

9. The apparatus according to claim 7, further comprising first and second NAND logic gates on data paths for the first and second read data, respectively, and a NOT logic gate coupled to input terminals the first and second NAND logic gates, wherein the second reset signal is provided to the NOT logic gate, and an output of the NOT logic gate is provided to the first and second NAND logic gates.

10. The apparatus according to claim 7, wherein the output data buffer includes a buffer control circuit coupled to the output data latch and a buffer circuit coupled to the buffer control circuit and the one or more TSVs, and the first reset signal is provided to the buffer control circuit.

11. The apparatus according to claim 1, wherein the data splitter is on a read data bus.

12. The apparatus according to claim 1, wherein the one or more TSVs are shared among the plurality of core dies for a read data operation, and the output of the read data to the one or more TSVs from a currently-selected core die is disabled when the output of the read data to the shared one or more TSVs from another core die of the plurality of core dies is enabled.

13. The apparatus according to claim 1, wherein the data output circuit includes a plurality of data output circuits in each core die, and the output control circuit is coupled to the plurality of data output circuits.

14. The apparatus according to claim 1, wherein the plurality of core dies include a plurality of memory core dies on an interface die.

15. An apparatus, comprising:
a plurality of through-silicon vias (TSVs);
a plurality of core dies stacked with one another, each core die of the plurality of core dies including a data output circuit coupled to one or more TSVs of the plurality of TSVs to output read data to the one or more TSVs, the data output circuit including:
a data splitter configured to provide first read data and second read data in parallel based on the read data, the first read data and the second read data being complementary;
an output data latch configured to latch the first read data and the second read data; and
an output data buffer configured to receive the first and second read data from the output data latch and drive the one or more TSVs based on the received first and second read data; and
an output control circuit configured to provide a first reset signal to the output data buffer and a second reset signal responsive to a read clock to the output data latch to disable the output of the read data to the one or more TSVs.

16. The apparatus according to claim 15, wherein a high edge of the second reset signal corresponds to a high edge of the read clock, and the read clock is an invalid read clock after a previous valid read clock.

17. The apparatus according to claim 15, wherein the second reset signal is provided to a gate of a transistor coupled to inverters of the output data latch to reset the output data latch.

18. An apparatus, comprising:
a plurality of through-silicon vias (TSVs);
a plurality of core dies stacked with one another, each core die of the plurality of core dies including a data output circuit coupled to one or more TSVs of the plurality of TSVs to output read data to the one or more TSVs, the data output circuit including:
a data splitter configured to provide first read data and second read data in parallel based on the read data, the first read data and the second read data being complementary;
an output data latch configured to latch the first read data and the second read data; and
an output data buffer configured to receive the first and second read data from the output data latch and drive the one or more TSVs based on the received first and second read data; and
an output control circuit configured to provide a first reset signal to the output data buffer and a second reset signal responsive to a core die select signal to the output data splitter to disable the output of the read data to the one or more TSVs.

19. The apparatus according to claim 18, further comprising first and second NAND logic gates on data paths for the first and second read data, respectively, and a NOT logic gate coupled to input terminals the first and second NAND logic gates, wherein the second reset signal is provided to the NOT logic gate, and an output of the NOT logic gate is provided to the first and second NAND logic gates.

20. The apparatus according to claim 18, wherein the output data buffer includes a buffer control circuit coupled to the output data latch and a buffer circuit coupled to the buffer control circuit and the one or more TSVs, and the first reset signal is provided to the buffer control circuit.

* * * * *